US012188733B2

(12) United States Patent
Mostafavi Yazdi et al.

(10) Patent No.: US 12,188,733 B2
(45) Date of Patent: *Jan. 7, 2025

(54) MODULAR FLUID HEAT EXCHANGE SYSTEMS

(71) Applicant: CoolIT Systems, Inc., Calgary (CA)

(72) Inventors: Seyed Kamaleddin Mostafavi Yazdi, Calgary (CA); Sean Mutlow, Calgary (CA); Robert Gould, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/217,425

(22) Filed: Jun. 30, 2023

(65) Prior Publication Data

US 2023/0349647 A1 Nov. 2, 2023

Related U.S. Application Data

(63) Continuation of application No. 17/326,185, filed on May 20, 2021, now Pat. No. 11,725,886.

(51) Int. Cl.
    *F28F 3/12* (2006.01)
    *F28F 9/02* (2006.01)
    *H05K 7/20* (2006.01)

(52) U.S. Cl.
    CPC .............. *F28F 3/12* (2013.01); *F28F 9/0246* (2013.01); *H05K 7/20254* (2013.01); *H05K 7/20272* (2013.01); *F28F 2250/08* (2013.01)

(58) Field of Classification Search
    CPC ........ F28F 3/12; F28F 9/0246; F28F 2250/08; H05K 7/20254; H05K 7/20272
    (Continued)

(56) References Cited

U.S. PATENT DOCUMENTS 3,073,385 A   1/1963  Peters
3,481,393 A  12/1969  Chu
              (Continued)

FOREIGN PATENT DOCUMENTS

CN   2562368    7/2003
DE  20305281   10/2003
              (Continued)

OTHER PUBLICATIONS

Dave Altavilla, "Asetek Antarctica WaterChill Water Cooling Kit.," HotHardware.com, Jun. 8, 2004, (https://hothardware.com/reviews/asetek-antarctica-waterchill-water-cooling-kit) last accessed on Nov. 3, 2020, 7 pages.

(Continued)

*Primary Examiner* — Claire E Rojohn, III
(74) *Attorney, Agent, or Firm* — WORKMAN NYDEGGER

(57) ABSTRACT

A modular heat exchange assembly includes a cold plate defining a finned surface and a corresponding plurality of microchannels. Selected ones of the plurality of microchannel extend from a first end to an opposed second end. A fluid receiver unit defines an inlet port and a first fluid connector fluidically coupled with the inlet port. A fluid transfer unit defines an outlet port and a second fluid connector matingly engageable with and disengageable from the first fluid connector to fluidly couple the fluid receiver unit and the fluid transfer unit together. The fluid transfer unit defines a distribution manifold configured to distribute coolant among the selected microchannels at a position between the first ends and the second ends of the selected microchannels. The fluid transfer unit further defines a collection manifold configured to receive coolant from the selected microchannels. The collection manifold and the outlet port are fluidically coupled together.

21 Claims, 19 Drawing Sheets

(58) Field of Classification Search
USPC .................................................. 165/80.4
See application file for complete search history.

(56) References Cited

U.S. PATENT DOCUMENTS

| | | | |
|---|---|---|---|
| 3,817,321 A | 6/1974 | Von Cube et al. |
| 3,861,826 A | 1/1975 | Dean, Jr. |
| 3,986,382 A | 10/1976 | Miller et al. |
| 4,139,330 A | 2/1979 | Neal |
| 4,345,643 A | 8/1982 | Dawson et al. |
| 4,450,472 A | 5/1984 | Tuckerman et al. |
| 4,561,040 A | 12/1985 | Eastman et al. |
| 4,563,620 A | 1/1986 | Komatsu |
| 4,564,040 A | 1/1986 | Rudelick |
| 4,750,086 A | 6/1988 | Mittal |
| 4,758,926 A | 7/1988 | Herrell et al. |
| 4,768,581 A | 9/1988 | Gotwald et al. |
| 4,898,153 A | 2/1990 | Sherwood |
| 4,909,315 A | 3/1990 | Nelson et al. |
| 4,940,085 A | 7/1990 | Nelson et al. |
| 5,016,090 A | 5/1991 | Galyon et al. |
| 5,070,936 A | 12/1991 | Carroll et al. |
| 5,099,311 A | 3/1992 | Bonde et al. |
| 5,203,401 A | 4/1993 | Hamburgen et al. |
| 5,218,515 A | 6/1993 | Bernhardt |
| 5,265,670 A | 11/1993 | Zingher |
| 5,277,232 A | 1/1994 | Borsheim |
| 5,294,830 A | 3/1994 | Young et al. |
| 5,309,319 A | 5/1994 | Messina |
| 5,441,102 A | 8/1995 | Burward-Hoy |
| 5,453,641 A | 9/1995 | Mundinger et al. |
| 5,535,818 A | 7/1996 | Fujisaki et al. |
| 5,592,363 A | 1/1997 | Atarashi et al. |
| 5,646,824 A | 7/1997 | Ohashi et al. |
| 5,684,671 A | 11/1997 | Hobbs et al. |
| 5,727,618 A | 3/1998 | Mundinger et al. |
| 5,731,954 A | 3/1998 | Cheon |
| 5,823,249 A | 10/1998 | Batchelder |
| 5,835,347 A | 11/1998 | Chu |
| 5,841,634 A | 11/1998 | Visser |
| 5,864,464 A | 1/1999 | Lin |
| 5,875,637 A | 3/1999 | Paetow |
| 5,998,240 A | 12/1999 | Hamilton et al. |
| 6,014,312 A | 1/2000 | Schulz-Harder et al. |
| 6,019,165 A | 2/2000 | Batchelder |
| 6,035,655 A | 3/2000 | Hare et al. |
| 6,166,907 A | 12/2000 | Chien |
| 6,256,378 B1 | 7/2001 | Iggulden et al. |
| 6,263,957 B1 | 7/2001 | Chen et al. |
| 6,327,145 B1 | 12/2001 | Lian et al. |
| 6,330,525 B1 | 12/2001 | Hays et al. |
| 6,361,287 B1 | 3/2002 | Hopper |
| 6,408,937 B1 | 6/2002 | Roy |
| 6,415,853 B1 | 7/2002 | Tao et al. |
| 6,415,860 B1 | 7/2002 | Kelly et al. |
| 6,422,304 B1 | 7/2002 | Slovikosky |
| 6,447,270 B1 | 9/2002 | Schmidt et al. |
| 6,470,289 B1 | 10/2002 | Peters et al. |
| 6,679,315 B2 | 1/2004 | Cosley et al. |
| 6,702,002 B2 | 3/2004 | Wang et al. |
| 6,748,755 B2 | 6/2004 | Kubo et al. |
| 6,769,258 B2 | 8/2004 | Pierson |
| 6,792,373 B2 | 9/2004 | Tabor |
| 6,819,563 B1 | 11/2004 | Chu et al. |
| 6,827,128 B2 | 12/2004 | Philpott et al. |
| 6,883,347 B2 | 4/2005 | Ayub |
| 6,894,899 B2 | 5/2005 | Wu et al. |
| 6,915,653 B2 | 7/2005 | Nakano et al. |
| 6,945,653 B2 | 9/2005 | Kobori et al. |
| 6,952,345 B2 | 10/2005 | Weber et al. |
| 6,973,801 B1 | 12/2005 | Campbell et al. |
| 6,986,382 B2 | 1/2006 | Upadhya et al. |
| 6,988,534 B2 | 1/2006 | Kenny et al. |
| 7,000,684 B2 | 2/2006 | Kenny et al. |
| 7,007,506 B2 | 3/2006 | Kubo et al. |
| 7,012,807 B2 | 3/2006 | Chu et al. |
| 7,021,367 B2 | 4/2006 | Oikawa |
| 7,029,647 B2 | 4/2006 | Tonkovich et al. |
| 7,032,651 B2 | 4/2006 | Winslow et al. |
| 7,044,198 B2 | 5/2006 | Matsushima et al. |
| 7,055,581 B1 | 6/2006 | Roy |
| 7,057,893 B2 | 6/2006 | Nicolai et al. |
| 7,086,247 B2 | 8/2006 | Campbell et al. |
| 7,104,312 B2 | 9/2006 | Goodson et al. |
| 7,123,996 B2 | 10/2006 | Fukushima et al. |
| 7,124,811 B2 | 10/2006 | Crocker et al. |
| 7,131,486 B2 | 11/2006 | Goodson et al. |
| 7,143,816 B1 | 12/2006 | Ghosh et al. |
| 7,149,084 B2 | 12/2006 | Matsushima et al. |
| 7,156,159 B2 | 1/2007 | Lovette et al. |
| 7,156,160 B2 | 1/2007 | Lee et al. |
| 7,190,580 B2 | 3/2007 | Bezama et al. |
| 7,201,217 B2 | 4/2007 | Johnson et al. |
| 7,206,203 B2 | 4/2007 | Campbell et al. |
| 7,209,355 B2 | 4/2007 | Koga et al. |
| 7,221,270 B2 | 5/2007 | Chen et al. |
| 7,248,006 B2 | 7/2007 | Bailey et al. |
| 7,259,965 B2 | 8/2007 | Chang et al. |
| 7,264,359 B2 | 9/2007 | Kawahara et al. |
| 7,274,566 B2 | 9/2007 | Campbell et al. |
| 7,278,273 B1 | 10/2007 | Whitted et al. |
| 7,301,771 B2 | 11/2007 | Hata et al. |
| 7,315,448 B1 | 1/2008 | Bash et al. |
| 7,318,322 B2 | 1/2008 | Ota et al. |
| 7,331,378 B2 | 2/2008 | Bhatti et al. |
| 7,360,582 B2 | 4/2008 | Olesen |
| 7,397,661 B2 | 7/2008 | Campbell et al. |
| 7,466,549 B2 | 12/2008 | Doerrich et al. |
| 7,466,553 B2 | 12/2008 | Hamman |
| 7,484,530 B2 | 2/2009 | Harvey et al. |
| 7,527,085 B2 | 5/2009 | Iijima et al. |
| 7,544,049 B2 | 6/2009 | Koga et al. |
| 7,562,444 B2 | 7/2009 | Vetter |
| 7,564,208 B2 | 7/2009 | Bailey et al. |
| 7,591,302 B1 | 9/2009 | Lenehan et al. |
| 7,599,184 B2 | 10/2009 | Upadhya et al. |
| 7,639,499 B1 | 12/2009 | Campbell et al. |
| 7,688,589 B2 | 3/2010 | Chiang |
| 7,757,506 B2 | 7/2010 | Ellsworth et al. |
| 7,762,314 B2 | 7/2010 | Campbell et al. |
| 7,791,882 B2 | 9/2010 | Chu et al. |
| 7,806,168 B2 | 10/2010 | Upadhya et al. |
| 7,905,106 B2 | 3/2011 | Attlesey |
| 7,925,746 B1 | 4/2011 | Melton |
| 7,957,144 B2 | 6/2011 | Goettert et al. |
| 7,961,465 B2 | 6/2011 | Goldrian et al. |
| 7,969,727 B2 | 6/2011 | Tozer et al. |
| 7,971,632 B2 | 7/2011 | Eriksen |
| 7,978,472 B2 | 7/2011 | Campbell et al. |
| 8,051,898 B2 | 11/2011 | Chiang |
| 8,066,057 B2 | 11/2011 | Olesen |
| 8,240,362 B2 | 8/2012 | Eriksen |
| 8,245,764 B2 * | 8/2012 | Eriksen ................ H01L 23/473 165/80.4 |
| 8,250,879 B2 | 8/2012 | Macbain et al. |
| 8,427,831 B2 | 4/2013 | Wei |
| 8,437,129 B2 | 5/2013 | Tung et al. |
| 8,441,789 B2 | 5/2013 | Wu et al. |
| 8,493,738 B2 | 7/2013 | Chainer et al. |
| 8,631,860 B2 | 1/2014 | Tang et al. |
| 8,687,364 B2 | 4/2014 | Chainer et al. |
| 8,724,315 B2 | 5/2014 | Branton |
| 8,746,330 B2 | 6/2014 | Lyon |
| 9,052,252 B2 | 6/2015 | Lyon et al. |
| 9,057,567 B2 | 6/2015 | Lyon |
| 9,453,691 B2 | 9/2016 | Lyon |
| 9,496,200 B2 | 11/2016 | Lyon |
| 9,603,284 B2 | 3/2017 | Lyon |
| 9,715,260 B2 | 7/2017 | Eriksen |
| 9,733,681 B2 | 8/2017 | Eriksen |
| 9,909,820 B2 | 3/2018 | Lyon |
| 10,078,354 B2 | 9/2018 | Eriksen |
| 10,078,355 B2 | 9/2018 | Eriksen |
| 10,222,144 B2 | 3/2019 | Kusuda |

(56) References Cited

U.S. PATENT DOCUMENTS

| | | |
|---|---|---|
| 10,274,266 B2 | 4/2019 | Lyon |
| 10,599,196 B2 | 3/2020 | Eriksen |
| 10,613,601 B2 | 4/2020 | Eriksen |
| 10,820,450 B2 | 10/2020 | Lyon |
| 10,842,043 B1 * | 11/2020 | Zhang ............... H05K 7/20254 |
| 11,175,102 B1 * | 11/2021 | Harrington ............ F28F 9/165 |
| 11,287,861 B2 | 3/2022 | Eriksen |
| 11,725,886 B2 * | 8/2023 | Mostafavi Yazdi ......................... H05K 7/20254 165/80.4 |
| 2002/0070007 A1 | 6/2002 | Calaman et al. |
| 2002/0153885 A1 | 10/2002 | Blossfeld |
| 2002/0189790 A1 | 12/2002 | Wong |
| 2003/0010050 A1 | 1/2003 | Scott |
| 2003/0019234 A1 | 1/2003 | Wayburn et al. |
| 2003/0070792 A1 | 4/2003 | Tanaka et al. |
| 2003/0085028 A1 | 5/2003 | Galtz |
| 2003/0151130 A1 | 8/2003 | Cheon |
| 2003/0173839 A1 | 9/2003 | Torii et al. |
| 2003/0230400 A1 | 12/2003 | McCordic et al. |
| 2004/0008483 A1 | 1/2004 | Cheon |
| 2004/0040695 A1 | 3/2004 | Chesser et al. |
| 2004/0042171 A1 | 3/2004 | Takamatsu et al. |
| 2004/0042172 A1 | 3/2004 | Kusaka et al. |
| 2004/0052049 A1 | 3/2004 | Wu et al. |
| 2004/0052663 A1 | 3/2004 | Laing et al. |
| 2004/0057211 A1 | 3/2004 | Kondo et al. |
| 2004/0104010 A1 | 6/2004 | Kenny et al. |
| 2004/0104012 A1 | 6/2004 | Zhou et al. |
| 2004/0104022 A1 | 6/2004 | Kenny et al. |
| 2004/0112571 A1 | 6/2004 | Kenny et al. |
| 2004/0112585 A1 | 6/2004 | Goodson et al. |
| 2004/0123614 A1 | 7/2004 | Stewart |
| 2004/0182548 A1 | 9/2004 | Lovette et al. |
| 2004/0182560 A1 | 9/2004 | Kenny et al. |
| 2004/0188066 A1 | 9/2004 | Upadhay et al. |
| 2004/0188069 A1 | 9/2004 | Tomioka et al. |
| 2004/0206477 A1 | 10/2004 | Kenny et al. |
| 2004/0240179 A1 | 12/2004 | Koga et al. |
| 2004/0250558 A1 | 12/2004 | Nakano et al. |
| 2005/0061482 A1 | 3/2005 | Lee et al. |
| 2005/0069432 A1 | 3/2005 | Tomioka |
| 2005/0126747 A1 | 6/2005 | Chu et al. |
| 2005/0128705 A1 | 6/2005 | Chu et al. |
| 2005/0178531 A1 | 8/2005 | Huang et al. |
| 2005/0180104 A1 | 8/2005 | Olesen et al. |
| 2005/0180107 A1 | 8/2005 | Naganawa et al. |
| 2005/0200001 A1 | 9/2005 | Joshi et al. |
| 2005/0205241 A1 | 9/2005 | Goodson et al. |
| 2005/0210906 A1 | 9/2005 | Laufer et al. |
| 2005/0211417 A1 | 9/2005 | Upadhay et al. |
| 2005/0241809 A1 | 11/2005 | Tomioka et al. |
| 2005/0259397 A1 | 11/2005 | Bash et al. |
| 2005/0269061 A1 | 12/2005 | Brewer et al. |
| 2006/0002080 A1 | 1/2006 | Leija et al. |
| 2006/0002088 A1 | 1/2006 | Bezama et al. |
| 2006/0011329 A1 | 1/2006 | Wang et al. |
| 2006/0094347 A1 | 5/2006 | Tracy et al. |
| 2006/0096738 A1 | 5/2006 | Kang et al. |
| 2006/0096740 A1 | 5/2006 | Zheng |
| 2006/0096743 A1 | 5/2006 | Lee et al. |
| 2006/0137863 A1 | 6/2006 | Lee et al. |
| 2006/0143439 A1 | 6/2006 | Arumugam et al. |
| 2006/0162903 A1 | 7/2006 | Bhatti et al. |
| 2006/0171801 A1 | 8/2006 | Manabe et al. |
| 2006/0185829 A1 | 8/2006 | Duan et al. |
| 2006/0185830 A1 | 8/2006 | Duan |
| 2006/0187638 A1 | 8/2006 | Vinson et al. |
| 2006/0225867 A1 | 10/2006 | Park et al. |
| 2006/0231238 A1 | 10/2006 | Ball, Jr. |
| 2006/0254755 A1 | 11/2006 | Chen et al. |
| 2007/0029069 A1 | 2/2007 | Duan |
| 2007/0034356 A1 | 2/2007 | Kenny et al. |
| 2007/0039719 A1 | 2/2007 | Eriksen |
| 2007/0095512 A1 | 5/2007 | Chen et al. |
| 2007/0107886 A1 | 5/2007 | Chen |
| 2007/0125526 A1 | 6/2007 | Satou et al. |
| 2007/0131396 A1 | 6/2007 | Yu et al. |
| 2007/0163750 A1 | 7/2007 | Bhatti et al. |
| 2007/0193724 A1 | 8/2007 | Lin |
| 2007/0209784 A1 | 9/2007 | Peng |
| 2007/0227704 A1 | 10/2007 | Nagai et al. |
| 2007/0227710 A1 | 10/2007 | Belady et al. |
| 2007/0256957 A1 | 11/2007 | Herrmann et al. |
| 2007/0272392 A1 | 11/2007 | Ghosh et al. |
| 2007/0297136 A1 | 12/2007 | Konshak |
| 2008/0041792 A1 | 2/2008 | Cmkovich et al. |
| 2008/0053641 A1 | 3/2008 | Lai et al. |
| 2008/0128114 A1 | 6/2008 | Lai et al. |
| 2008/0179045 A1 | 7/2008 | Hu et al. |
| 2008/0266726 A1 | 10/2008 | Murakami et al. |
| 2008/0288124 A1 | 11/2008 | Huang |
| 2008/0301941 A1 | 12/2008 | Anderson, Jr. et al. |
| 2008/0314367 A1 | 12/2008 | Goulette et al. |
| 2009/0021807 A1 | 1/2009 | Horita |
| 2009/0071625 A1 | 3/2009 | Lyon |
| 2009/0101315 A1 | 4/2009 | Cheng |
| 2009/0120622 A1 | 5/2009 | Koch |
| 2009/0139698 A1 | 6/2009 | Robinson |
| 2009/0154096 A1 | 6/2009 | Iyengar et al. |
| 2009/0228893 A1 | 9/2009 | Behrendt et al. |
| 2010/0012294 A1 | 1/2010 | Bezama et al. |
| 2010/0085708 A1 | 4/2010 | Martin et al. |
| 2010/0101765 A1 | 4/2010 | Campbell et al. |
| 2010/0103619 A1 | 4/2010 | Rafai-ahmed et al. |
| 2010/0103620 A1 | 4/2010 | Campbell et al. |
| 2010/0139887 A1 | 6/2010 | Slessman |
| 2010/0179695 A1 | 7/2010 | Collins et al. |
| 2010/0211669 A1 | 8/2010 | Dalgas et al. |
| 2010/0324962 A1 | 12/2010 | Nesler et al. |
| 2010/0326634 A1 | 12/2010 | Eriksen |
| 2011/0084839 A1 | 4/2011 | Groth et al. |
| 2011/0100045 A1 | 5/2011 | Carlson |
| 2011/0100618 A1 | 5/2011 | Carlson |
| 2011/0127027 A1 | 6/2011 | Kashirajima et al. |
| 2011/0154842 A1 | 6/2011 | Heydari et al. |
| 2011/0168379 A1 | 7/2011 | Morgan et al. |
| 2011/0174001 A1 | 7/2011 | Carlson et al. |
| 2011/0175498 A1 | 7/2011 | Bash et al. |
| 2011/0313576 A1 | 12/2011 | Nicewonger |
| 2012/0087088 A1 | 4/2012 | Killion et al. |
| 2012/0103009 A1 | 5/2012 | Ding et al. |
| 2012/0147553 A1 | 6/2012 | Eriksen |
| 2012/0152498 A1 | 6/2012 | Lyon |
| 2012/0170222 A1 | 7/2012 | Dede et al. |
| 2012/0175094 A1 | 7/2012 | Rice |
| 2012/0271567 A1 | 10/2012 | Da Pont et al. |
| 2012/0273159 A1 | 11/2012 | Eriksen |
| 2013/0025818 A1 | 1/2013 | Lyon |
| 2014/0158326 A1 | 6/2014 | Lyon |
| 2014/0186156 A1 | 7/2014 | Lai et al. |
| 2014/0251582 A1 | 9/2014 | Lyon |
| 2014/0266744 A1 | 9/2014 | Lyon et al. |
| 2015/0168474 A1 | 6/2015 | Yoshioka et al. |
| 2015/0355630 A1 | 12/2015 | Cader et al. |
| 2016/0146219 A1 | 5/2016 | Lyon |
| 2016/0281704 A1 | 9/2016 | Lyon et al. |
| 2016/0377355 A1 | 12/2016 | Lyon |
| 2017/0064874 A1 | 3/2017 | Lyon |
| 2017/0196116 A1 | 7/2017 | Lyon |
| 2017/0329376 A1 | 11/2017 | Eriksen |
| 2018/0195810 A1 | 7/2018 | Lyon |
| 2019/0204026 A1 | 7/2019 | Lyon |
| 2020/0227341 A1 * | 7/2020 | Neal ........................ F28F 3/12 |
| 2020/0340767 A1 * | 10/2020 | Holden .................. G01M 3/16 |
| 2020/0348202 A1 * | 11/2020 | Farkas .................. H05K 1/162 |
| 2021/0045262 A1 | 2/2021 | Lyon |
| 2021/0127528 A1 | 4/2021 | Lyon |
| 2022/0151099 A1 | 5/2022 | Gao |
| 2022/0151104 A1 | 5/2022 | Gao |
| 2022/0232732 A1 | 7/2022 | Alvarado et al. |

(56) References Cited

U.S. PATENT DOCUMENTS

| | | |
|---|---|---|
| 2022/0373275 A1 | 11/2022 | Mostafavi et al. |
| 2022/0377937 A1 | 11/2022 | Chen et al. |

FOREIGN PATENT DOCUMENTS

| | | |
|---|---|---|
| EP | 0574823 | 12/1993 |
| EP | 0610826 | 8/1994 |
| EP | 1808892 | 7/2007 |
| JP | 61032449 | 2/1986 |
| JP | H03-17443 | 1/1991 |
| JP | 06120387 | 4/1994 |
| JP | H07142886 | 6/1995 |
| JP | H832262 | 2/1996 |
| JP | 2002151638 | 5/2002 |
| JP | 3452059 | 9/2003 |
| JP | 2005-123496 A | 5/2005 |
| JP | 2000208683 | 7/2007 |
| JP | 2007180505 | 7/2007 |
| JP | 2007227902 | 9/2007 |
| JP | 2007531991 | 11/2007 |
| JP | 3179086 U | 10/2012 |
| KR | 20030031027 | 4/2003 |
| KR | 20-2003-0006043 Y1 | 5/2003 |
| KR | 200314041 | 5/2003 |
| TW | M244511 | 9/2004 |
| TW | M244513 | 9/2004 |
| TW | M251183 | 11/2004 |
| TW | M251442 | 11/2004 |
| TW | M256682 | 2/2005 |
| TW | M273031 | 8/2005 |
| TW | M275684 | 9/2005 |
| TW | M298733 | 10/2006 |
| TW | M324810 | 1/2008 |
| TW | 200926951 | 6/2009 |
| WO | 2001065900 | 9/2001 |
| WO | 2003055055 | 7/2003 |
| WO | 03/98415 A1 | 11/2003 |
| WO | 2004/042306 A2 | 5/2004 |
| WO | 2005017468 | 2/2005 |
| WO | 2005096377 | 10/2005 |
| WO | 2006052317 | 5/2006 |
| WO | 2006119761 | 11/2006 |

OTHER PUBLICATIONS

Notice of Allowance in U.S. Appl. No. 15/912,478, mailed Mar. 6, 2019, 11 pages.
Non-Final Office Action for U.S. Appl. No. 14/283,163, mailed Sep. 30, 2014, 10 pages.
Final Office Action for U.S. Appl. No. 14/283,163, mailed May 14, 2015, 13 pages.
Non-Final Office Action for U.S. Appl. No. 14/283,163, mailed Sep. 4, 2015, 13 pages.
Final Office Action for U.S. Appl. No. 14/283,163, mailed Jun. 15, 2016, 12 pages.
Notice of Allowance in U.S. Appl. No. 14/283,163, mailed Jan. 19, 2017, 17 pages.
Non-Final Office Action in U.S. Appl. No. 15/462,753, mailed May 11, 2017, 11 pages.
Final Office Action in U.S. Appl. No. 15/462,753, mailed Sep. 15, 2017, 14 pages.
USPTO Examiner's Answer in U.S. Appl. No. 15/462,753, mailed Jan. 24, 2019, 16 pages.
USPTO Patent and Trial Appeal Board Decision on Appeal in U.S. Appl. No. 15/462,753, mailed Aug. 25, 2020, 20 pages.
Rob Darby, "Internal Flow Applications," Chemical Engineering Fluid Mechanics, 2001, pp. 195-238, Chapter 7, Marcel Dekker, Inc., New York, NY.
John S. Scott, "Header" and "Manifold," Dictionary of Civil Engineering, 4th Edition, 1993, pp. 211 and 269, Van Nostrand Reinhold, New York, NY.
Petition for Inter Partes Review in *Asetek Danmark A/S v. CoolIT Systems, Inc.*, Mar. 26, 2020, Case IPR2020-00747.
Patent Owner's Preliminary Response in *Asetek Danmark A/S v. CoolIT Systems, Inc.*, Jul. 7, 2020, Case IPR2020-00747.
Petitioner's Reply to Patent Owner's Preliminary Response in *Asetek Danmark A/S v. CoolIT Systems, Inc.*, Jul. 24, 2020, Case IPR2020-00747.
Patent Owner's Sur-Reply in Support of Patent Owner's Preliminary Response in *Asetek Danmark A/S v. CoolIT Systems, Inc.*, Aug. 7, 2020, Case IPR2020-00747.
Institution Decision entered Oct. 2, 2020, Case IPR2020-00747.
Declaration of Donald E. Tilton, Ph.D. in *Asetek Danmark A/S v. CoolIT Systems, Inc.*, Mar. 25, 2020, Case IPR2020-00747.
Petition for Inter Partes Review in *Asetek Danmark A/S v. CoolIT Systems, Inc.*, Apr. 10, 2020, Case IPR2020-00825.
Patent Owner's Preliminary Response in *Asetek Danmark A/S v. CoolIT Systems, Inc.*, Jul. 14, 2020, Case IPR2020-00825.
Petitioner's Reply to Patent Owner's Preliminary Response in *Asetek Danmark A/S v. CoolIT Systems, Inc.*, Jul. 31, 2020, Case IPR2020-00825.
Patent Owner's Sur-Reply in Support of Patent Owner's Preliminary Response in *Asetek Danmark A/S v. CoolIT Systems, Inc.*, Jul. 31, 2020, Case IPR2020-00825.
Institution Decision entered Oct. 13, 2020, IPR2020-00825.
Declaration of Donald E. Tilton, Ph.D. in *Asetek Danmark A/S v. CoolIT Systems, Inc.*, Apr. 10, 2020, Case IPR2020-00825.
Non-Final Office Action for U.S. Appl. No. 15/912,478, mailed Oct. 15, 2018, 6 pages.
"Refrigerador de CPUs WaterChill Antarctica Para Intel Socket 478, AMD Socket 462/754/939/940," Jun. 4, 2004 and Oct. 18, 2004, 9, pages, Version 4.0 & 4.1, Asetek, Inc.
"WaterChill CPU Cooler Antarctica for Intel Socket 478, AMD Socket 462/754/939/940," Jun. 4, 2004 & Oct. 18, 2004, 9 pages, Version 4.0 & 4.1, Asetek, Inc.
"WaterChill CPU-Kühler Antarctica Für Intel Socket 478, AMD Socket 462/754/939/940," Jun. 4, 2004, & Oct. 18, 2004, 9 pages, Version 4.0 & 4.1, Asetek, Inc.
Non-Final Office Action in U.S. Appl. No. 16/297,289, mailed May 6, 2020, 6 pages.
"WaterChill CPU Cooler Antarctica Pour Port Intel Socket 478, AMD Socket 462/754/939/940," Jun. 4, 2004 & Oct. 18, 2004, 10 pages, Version 4.0 & 4.1, Asetek, Inc.
"Asetek WaterChill" Techspot, Mar. 14, 2006 (https://www.techspot.com/community/topics/asetek-waterchill.46119/), last accessed Sep. 30, 2021, 7 pages.
"Asetek Antarctica Waterblock" Overlookers, Feb. 28, 2004 (https://www.overclockers.com/asetek-antarctica-waterblock/) last accessed, Sep. 30, 2021, 6 pages.
"Asetek Antarctica WaterChill CPU Cooling Kit Review," Overclocker Club, Apr. 25, 2004 (https://www.overclockersclub.com/reviews/asetek/5.htm) last accessed Sep. 30, 2021.
Altavilla, Dave, "Asetek Antarctica WaterChill Water Cooling Kit" Hot Hardware, Inc., Jun. 8, 2004, 4 pages (https://hothardware.com/reviews/asetek-antarctica-waterchill-water-cooling-kit) last accessed Sep. 30, 2021.
Ryszard Sommefeldt, "Review: Asetek WaterChill Antarctica KT03A-L30," HEXUS.net, Aug. 2, 2004, 3 pages (https://m.hexus.net/tech/reviews/cooling/791-asetek-waterchill-antarctica-kt03a-I30/?page=2) last accessed Sep. 30, 2021.
"Asetek Reviews" TechPowerUp Review Database (https://www.techpowerup.com/reviewdb/Cooling/Water/Asetek/) last accessed Sep. 30, 2021, 3 pages.
Centrifugal Pump Overview, Appendix B., http://nptel.ac.in/courses/112104117/ui/Course_home-8.htm, Jan. 5, 2018, pp. 1-10.
USPTO Patent Trial and Appeal Board Final Written Decision in Case IPR2015-01276 dated Dec. 8, 2016.
USPTO Patent Trial and Appeal Board Decision of Institution of Inter Parties Review, filed Dec. 9, 2015 in Case IPR2015-01276.
Patent Owner's Response, filed Mar. 9, 2016 in Case IPR2015-01276.
Petition for Inter Parties Review of U.S. Pat. No. 8,746,330 in *Asetek Danmark A/S v. CoolIT Systems Inc.*, filed May 27, 2015.

(56) References Cited

OTHER PUBLICATIONS

Declaration of Dr. Donald Tilton (including his CV) from Petition for Inter Parties Review of U.S. Pat. No. 8,746,330 in *Asetek Danmark A/S* v. *CoolIT Systems Inc.*, dated May 27, 2015.
Knight, et al., "Heat Sink Optimization with Application to Microchannels," IEEE Transactions on Components, Hybrids, and Manufacturing Technology, vol. 15, No. 5, Oct. 1992, pp. 832-842.
Kandlikar, "High Flux Heat Removal with Microchannels—a Roadmap of Challenges and Opportunities," Heat Transfer Engr'g. 26(8):5-14 (2005).
Steineke, Mark E., et al., "Single-Phase Heat Transfer Enhancement Techniques in Microchannel and Minichannel Flows," Michrochannels and Minichannels—Jun. 17-19, 2004, Rochester, New York, USA (2004).
Preissuance Submission dated Jan. 9, 2015, U.S. Appl. No. 13/401,618.
Examination Report dated Mar. 11, 2011 in European Application No. 07075014.6, 9 pages.
Technical Opinion with English Translation dated Jan. 10, 2013 in Japanese Registration No. 3179086 (Utility Model Application No. 2012-002117), 7 pages.
Search Report and Examination with English Translation for Taiwan Application No. 101110072, dated Apr. 9, 2014, 40 pages.
Office Action for U.S. Appl. No. 12/189,476, mailed Apr. 13, 2012, 17 pages.
Final Office Action for U.S. Appl. No. 12/189,476, mailed Jan. 7, 2013, 10 pages.
Non-Final Office Action in U.S. Appl. No. 15/263,210, mailed Feb. 10, 2017, 5 pages.
Non-Final Office Action in U.S. Appl. No. 13/401,618, mailed Jul. 28, 2015, 20 pages.
Final Office Action in U.S. Appl. No. 13/401,618, mailed Jan. 26, 2016, 23 pages.
Non-Final Office Action in U.S. Appl. No. 14/283,163, mailed Sep. 30, 2014, 10 pages.
Final Office Action in U.S. Appl. No. 14/283,163, mailed May 14, 2015, 15 pages.
Non-Final Office Action in U.S. Appl. No. 14/283,163, mailed Sep. 4, 2015, 15 pages.
"WaterChill CPU Cooler Antarctica Pour Port Intel Socket 478, AMD Docket 462/754/939/940," Jun. 4, 2004 & Oct. 18, 2004, 10 pages, Version 4.0 & 4.1, Asetek, Inc.
CPU-360 Water Block (AMD/Intel Processor). Rev 1.1, Koolance, (https://koolance.com/cpu-360-processor-water-block) last accessed on Oct. 30, 2020, 1 page.
Hilbert Hagedoom, "Koolance CPU-360 Waterblock," Guru.com, Feb. 9, 2010, (https://www.guru3d.com/news-story/koolance-cpu-360-waterblock), last accessed on Nov. 3, 2020, 2 pages.
Matthew Homan, "WaterChill by Asetek," TechwareLabs, LLC, Dec. 11, 2004, (http://www.techwarelabs.com/reviews/cooling/asetek_waterchill/) last accessed on Oct. 30, 2020 3 pages.
3Dgameman, "#530—Asetek WaterChill2 Water Cooling Kit," YouTube, Jul. 16, 2006, (https://www.youtube.com/watch?v=60XNAXO9cxY) last accessed on Oct. 30, 2020.
3Dgameman, "#596—Asetek Xtreme WaterChill Water Cooling Kit," YouTube, Jul. 17, 2006, (https://www.youtube.com/watch?v=Z9XSJBCJttU) last accessed on Oct. 29, 2020.
Adrian Willson, "(1080) Koolance CPU 360 CPU Waterblock Review," YouTube, Mar. 14, 2010, (https://www.youtube.com/watch?v=hhWP7rF1uQs) last accessed on Oct. 30, 2020.
Super1080P, "(1080) Koolance CPU 360 CPU Waterblock Review," YouTube, Mar. 17, 2010, (https://www.youtube.com/watch?v=3kg4Yvl1XLU) last accessed on Oct. 30, 2020.
"WaterChill CPU Cooler Antarctica for Intel Socket 478, AMD Socket A/754/940," Apr. 13, 2004, 14 pages, Version 4.0, Asetek, Inc.
"WaterChill CPU Cooler Antarctica for Intel Socket 478, AMD Socket 462/754/940," Jun. 4, 2004, 9 pages, Version 4.1, Asetek, Inc.

"WaterChill CPU Cooler Antarctica for Intel Socket 478, AMD Socket A/754/940," Mar. 30, 2004, 2 pages, Version 4.0, Asetek, Inc.
"WaterChill CPU Cooler Antarctica Pour Port Intel Socket 478, AMD Socket 462/754/940," Jun. 4, 2004, 10 pages, Version 4.0, Asetek, Inc.
"WaterChill CPU-Kühler Antarctica Für Intel Socket 478, AMD Socket 462/754/940," Jun. 4, 2004, 10 pages, Version 4.0, Asetek, Inc.
International Search Report and Written Opinion for PCT Application No. PCT/IB2022/054242, mailed Aug. 27, 2022, 9 pages.
Patel, et al., "Computational Fluid Dynamics Modeling of High Compute Density Data Centers to Assure System Inlet Air Specifications," The Pacific Rim/ASME International Electronic Packaging Technical Conference and Exhibition Jul. 8-13, 2001, ASME, Kauai, Hawaii, USA.
Steve Burke, NZXT Kraken X52, X62, & X42 Review & Benchmarks vs. H100iV2, Predator 280, Gamers Nexus (Oct. 29, 2016, 12:14 pm), https://www.gamersnexus.net/hwreviews/2662-nzxt-kraken-x52-x62-x42-review-and-benchmarks-noise-temp (last visited Jan. 5, 2023).
Garrett Carver, NZXT Kraken Z73 Review: Pretty, Pricey Performance, Tom's Hardware (Jan. 28, 2020), https://www.tomshardware.com/reviews/nzxt-kraken-z73 (last visited Jan. 5, 2023).
Rich Edmonds, NZXT Kraken Z63 and Z73 review: Amazing AIO coolers with a fancy LCD display, Windows Central (Jan. 28, 2020), https://www.windowscentral.com/nzxt-kraken-z63-z73-review (last visited Jan. 5, 2023).
Chad Sebring, Asus Rog Strix LC 120 RGB CPU Cooler Review, TweakTown (Aug. 20, 2020, 9:40 am CDT), https://www.tweaktown.com/reviews/9556/asus-rog-strix-lc-120-rgb-cpu-cooler/index.html (last visited Jan. 5, 2023).
Asetek 645LT 92 mm AIO: The small and famous cooler is back!, Glob3trotters, http://glob3trotters.com/portfolio/asetek-645lt-92-mm-aio-the-small-and-famous-cooler-is-back/ (last visited Jan. 5, 2023).
"Adjacent" Merriam-Webster's Collegiate Dictionary, 10th ed. 2001, p. 14, Springfield, MA.
Viton™ Fluoroelastomers: High-Performance, available from www.viton.com/en/products (last visited Jan. 5, 2023).
Vegas, et al., "Stiffness, Compliance, Resilience, and Creep Deformation: Understanding Implant-Soft Tissue Dynamics in the Augmented Breast: Fundamentals Based on Materials Science", Aesth Plast Surg 37:922-930 (2013).
Merriam Webster's Collegiate Dictionary (11th ed. 2011), 413, 765 (definitions of "mate" and "engage").
Zhang, et al. "Single Phase Liquid Cooled Microchannel Heat Sink for Electronic Packages," Applied Thermal Engineering 25, May 25, 2004.
Brazing Handbook (4th ed. 1991), American Welding Society, copyright 2002.
Shigley, et al. (eds.), "Standard Handbook of Machine Design," McGraw-Hill 2 ed. 1996.
Callister, Jr., et al. "Mechanical Propertiesof Metals," Materials Science and Engineering—An Introduction, Eighth Ed. 2010, pp. 150-196.
Ashby, et al., Engineering Materials 1: An Introduction to Properties, Applications, and Design, Ch. 3:29-53, Ch. 8:115-133 (4th ed. 2012.
Concise Oxford English Dictionary (12th ed. 2011), 741 (definition of "interlock").
Petrie, "Handbook of Adhesives and Sealants" Ch 1 (Intoduction to Adhesive and Sealant), Ch 2 (Therories of Adhesion).
Smith, Mechanical Engineer's Reference Book, 12th ed., 1994, Section 16.4 (Adhesives), 19 pages.
Office Action for Taiwan Application No. 111118805, mailed Jan. 7, 2023, 4 pages.
Patent Owner's Response in *Asetek Danmark A/S* v. *CoolIT Systems, Inc.*, Nov. 30, 2020, Case IPR2020-0523.
Patent Owner's Response in *Asetek Danmark A/S* v. *CoolIT Systems, Inc.*, Nov. 30, 2020, Case IPR2020-0524.
Petition for Inter Parties Review of U.S. Pat. No. 8,746,330 in *Asetek Danmark A/S* v. *CoolIT Systems Inc.* filed May 27, 2015.

(56) References Cited

OTHER PUBLICATIONS

Petition for Inter Partes Review in *Asetek Danmark A/S* v. *CoolIT Systems, Inc.*, Feb. 7, 2020, Case IPR2020-00522.
Petition for Inter Partes Review in *Asetek Danmark A/S* v. *CoolIT Systems, Inc.*, Feb. 7, 2020, Case IPR2020-00523.
Petition for Inter Partes Review in *Asetek Danmark A/S* v. *CoolIT Systems, Inc.*, Feb. 7, 2020, Case IPR2020-00524.
Petition for Inter Partes Review of U.S. Pat. No. 8,749,968; United States Patent and Trademark Office, Before the Patent Trial and Appeal Board, *CoolIT Systems, Inc.* v. *Asetek A/S*, Inter Parties Review No. 2014-01172, Jul. 16, 2014, 61 pages.
Petitioner's Reply to Patent Owner's Preliminary Response in *Asetek Danmark A/S* v. *CoolIT Systems, Inc.*, Jun. 5, 2020, Case IPR2020-00522.
Petitioner's Reply to Patent Owner's Preliminary Response in *Asetek Danmark A/S* v. *CoolIT Systems, Inc.*, Jun. 5, 2020, Case IPR 2020-0524.
Petitioner's Reply to Patent Owner's Preliminary Response in *Asetek Danmark A/S* v. *CoolIT Systems, Inc.*, Jun. 5, 2020, Case IPR2020-0523.
Pollard, United States Patent and Trademark Office Patent Owner's Response. Filed Mar. 9, 2016 in Case PR2015-01276.
Preliminary Amendment dated Jan. 9, 2009, p. 4., U.S. Appl. No. 11/919,974.
Preliminary Amendment dated Jul. 14, 2011, "Marked-Up Copy of Substitute Specification," U.S. Appl. No. 11/919,974.
Preliminary Amendment dated Mar. 10, 2011, p. 7, U.S. Appl. No. 11/919,974.
Preliminary Amendment dated Nov. 6, 2007, p. 3, U.S. Appl. No. 11/919,974.
Reexam Control No. U.S. Appl. No. 95/002,386, Decision on Appeal, Apr. 29, 2016, reh'g denied, Sep. 19, 2016.
Reexam Control No. U.S. Appl. No. 95/002,386, Right of Appeal Notice, Jun. 30, 2014, p. 3-4.
Refrigerador de CPUs WaterChill Antarctica Para Intel Socket 478, AMD Socket 462/754/940, Jun. 4, 2004, 9, pages, Version 4.0, Asetek, Inc.
Schmidt, R.R., "Liquid Cooling is Back," Electronics Cooling Magazine, Published Aug. 1, 2005, Retrieved from the Internet URL: https://www.electronics-cooling.com/2005/08/liquid-cooling-is-back/, on Apr. 30, 2014, pp. 1-7.
Super1080p, "(1080) Koolance CPU 360 CPU Waterblock Review," YouTube, Mar. 17, 2010, (https://www.youtube.com/watch?v=3kg4Yvl1XLU) last accessed on Oct. 30, 2020. (Year: 2010).
Translation of JP2005123496A entitled TRANSLATION-JP2005123496A (Year: 2023).
U.S. Appl. No. 13/269,234, Amendment, Apr. 6, 2012, p. 8-10.
U.S. Appl. No. 13/269,234, Notice of Allowability dated May 23, 2012, p. 2-3.
Vertal, L. "Water Cooling Comes of Age Again," Asetek Data Center Liquid Cooling, Published on Oct. 11, 2013, Retrieved from the Internet URL: http://www.asetek.com/press-room/blog/2013/water-cooling-come-of-age- again/, on Jan. 4, 2018, pp. 1-10.
Asetek WaterChill Antarctica Water Cooling Kit, Asetek, (https://www.extremeoverclocking.com/reviews/cooling/WaterChill_Antarctica_1.html) last accessed on Oct. 30, 2020, 11 pages.
Chinese-language Preliminary Examination Report for Taiwan Patent Application No. 101110072; 20 pages.
Chinese-language Search and Examination Reports dated Apr. 9, 2014, for Taiwan Patent Application No. 101110072 (English translation included); 40 pages total.
Claim Construction Order (Dkt. 149), 26-29, *Asetek A/S* v. *CoolIT Systems, Inc.*, 3:19-cv-00410-EMC, (N.D. Cal. Jul. 22, 2020), 45 pgs.
Claim Construction Order, Docket 258, *Asetek Denmark A/S* v. *CoolIT Systems, Inc.*, 3:19-cv-00410-EMC (N.D. Cal., Jul. 8, 2021).
Corrected Declaration of Himanshu Pokharna, Ph.D., Exhibit 2038, *Asetek Denmark A/S* v. *CoolIT Systems, Inc.*, IPR2020-00825 (P.T. A.B., Oct. 12, 2021) (on appeal to CAFC, stipulated motion to withdraw appeal pending).

Declaration of Arpita Bhattacharyya in *Asetek Danmark A/S* v. *CoolIT Systems, Inc.*, May 26, 2020, Case IPR2020-0524.
Declaration of Donald E. Tilton, Ph. D. in *Asetek Danmark A/S* v. *CoolIT Systems, Inc.*, Nov. 30, 2020, Case IPR2020-0522.
Declaration of Donald E. Tilton, Ph.D. in *Asetek Danmark A/S* v. *CoolIT Systems, Inc.*, Nov. 30, 2020, Case IPR2020-0523.
Declaration of Donald E. Tilton, Ph.D. in *Asetek Danmark A/S* v. *CoolIT Systems, Inc.*, Nov. 30, 2020, Case IPR2020-0524.
Declaration of Donald E. Tilton, PH.D. in *Asetek Danmark NS* v. *CoolIT Systems, Inc.*, Apr. 10, 2020, Case IPR2020-00825.
Declaration of John Hamill in *Asetek Danmark A/S* v. *CoolIT Systems, Inc.*, Nov. 25, 2020, Case IPR2020-0523.
Declaration of Joseph Rosselli, Q.C. in *Asetek Danmark A/S* v. *CoolIT Systems, Inc.*, May 23, 2020, Case IPR2020-0523.
Declaration of Joseph Rosselli, Q.C. in *Asetek Danmark A/S* v. *CoolIT Systems, Inc.*, May 23, 2020, Case IPR2020-0524.
Declaration of Marc Hodes, Ph.D., Exhibit 2001, *Asetek Denmark A/S* v. *CoolIT Systems, Inc.*, IPR2020-00825 (P.T.A. B., Oct. 12, 2021) (on appeal to CAFC, stipulated motion to withdraw appeal pending).
Declaration of Robert F. McCauley in *Asetek Danmark A/S* v. *CoolIT Systems, Inc.*, May 26, 2020, Case IPR2020-0523.
Declaration of Robert F. McCauley in *Asetek Danmark A/S* v. *CoolIT Systems, Inc.*, Oct. 14, 2020, Case IPR2020-0522.
Declaration of Robert F. McCauley in *Asetek Danmark A/S* v. *CoolIT Systems, Inc.*, Oct. 14, 2020, Case IPR2020-0524.
Ellsworth, M.J. Jr. et al., "The Evolution of Water Cooling for IBM Large Server Systems: Back to the Future," IEEE, CoolIT Systems Inc. Exhibit 1017, pp. 1-9, (2008).
Ellsworth, M.J. Jr. P.E., "Thermal Design and Implementation of Robust Liquid Cooling Systems for High Performance Computer Systems," Systems and Technology Group, IBM, InterPACK '11, dated Jul. 6-8, 2011, pp. 1-64.
Examiner's Answer in U.S. Appl. No. 15/462,753, mailed Jan. 24, 2019, 16 pages.
Filing Receipt mailed Aug. 21, 2007 for U.S. Appl. No. 60/954,987 filed Aug. 9, 2007.
Final Office Action dated Jan. 7, 2013, for U.S. Appl. No. 12/169,476, of Lyon, G.S., filed Aug. 11, 2008.
Final Office Action for U.S. Appl. No. 15/462,753 mailed Nov. 20, 2023.
Final Office Action in U.S. Appl. No. 13/559,340, mailed Sep. 8, 2015, 13 pages.
Final Written Decision, Paper 50, *Asetek Denmark A/S* v. *CoolIT Systems, Inc.*, IPR2020-00825 (P.T.A.B., Oct. 12, 2021) (on appeal to CAFC, stipulated motion to withdraw appeal pending).
Gabriel Torres, CoolIT Water-Cooling Products, http://hardwaresecrets.com/printpage/CoolIT-Water-Cooling-Product/515, Jan. 14, 2008, 9 pages.
Hilbert Hagedoom, "Aseteck Waterchill Watercooling—p. 1—a Chill Introduction," Guru3D.com, Feb. 28, 2005, 25 pages.
https://www.researchgate.net/publication/3521254, titled "Microchannel heat exchanger optimization", George Harpole, Mar. 1991.
Institution Decision entered Aug. 24, 2020, Case IPR2020-00522.
Institution Decision entered Aug. 24, 2020, Case IPR2020-00523.
Institution Decision entered Aug. 24, 2020, Case IPR2020-00524.
International Preliminary Report on Patentability received for PCT Patent Application No. PCT/IB2022/054242, mailed on Nov. 30, 2023, 5 pages.
Knight, R.W., et al., "Heat Sink Optimization with Application to Microchannels," IEEE Transactions on Components, Hybrids, and Manufacturing Technology, vol. 15, No. 5, Oct. 1992, pp. 832-842.
Non-Final Office Action dated Apr. 13, 2012, for U.S. Appl. No. 12/169,476, of Lyon, G.S., filed Aug. 11, 2008.
Non-Final Office Action for U.S. Appl. No. 17/079,225 mailed Nov. 28, 2023.
Non-Final Office Action for U.S. Appl. No. 15/462,753 mailed May 3, 2023.
Non-Final Office Action in U.S. Appl. No. 13/559,340, mailed Jan. 15, 2016, 22 pages.
Non-Final Office Action in U.S. Appl. No. 13/559,340, mailed Mar. 26, 2015, 12 pages.

(56) References Cited

OTHER PUBLICATIONS

Non-Final Office Action in U.S. Appl. No. 14/777,510, mailed Apr. 23, 2018, 23 pages.
Non-Final Office Action in U.S. Appl. No. 15/351,362, mailed Nov. 18, 2019, 12 pages.
Non-Final Office Action in U.S. Application No. 15/354, 981, mailed May 8, 2018, 19 pages.
NZXT Kraken Z73 Review, https://www.ocinside.de/review/nzxt_kraken_z73/# (last visited Jan. 5, 2023).
Office Action for U.S. Appl. No. 15/462,753 mailed Feb. 2, 2021.
Office Action for U.S. Appl. No. 17/079,225 mailed May 11, 2022.
Office Action received for Chinese Patent Application No. 202280043891.1, mailed on Jun. 25, 2024, 14 pages (5 pages of English Translation and 9 pages of Original Document).
Osinski, USPTO Decision of Institution of Inter Parties Review, filed Dec. 9, 2015 in Case IPR2015-01276.
Patent Owner's Preliminary Response in *Asetek Danmark A/S v. CoolIT Systems, Inc.*, May 26, 2020, Case IPR2020-0523.
Patent Owner's Preliminary Response in *Asetek Danmark A/S v. CoolIT Systems, Inc.*, May 26, 2020, Case IPR2020-0524.
Patent Owner's Response in *Asetek Danmark A/S v. CoolIT Systems, Inc.*, Nov. 30, 2020, Case IPR2020-00522.

\* cited by examiner

MODULAR FLUID HEAT EXCHANGE SYSTEMS

RELATED APPLICATIONS

This application claims benefit of and priority to U.S. patent application Ser. No. 17/326,185, filed May 20, 2021, which patent application is hereby incorporated by reference in its entirety as fully as if reproduced in whole herein, for all purposes.

BACKGROUND

The innovations and related subject matter disclosed herein (collectively referred to as the "disclosure") generally pertain to modular fluid heat exchange systems. Some systems are described in relation to electronics cooling applications by way of example, though the disclosed innovations may be used in a variety of other applications.

Fluid heat exchange systems and associated components are used to cool electronic and other devices by accepting and dissipating thermal energy therefrom.

Such systems seek to dissipate to a fluid passing there through, thermal energy communicated to them from a heat source, e.g., an electronic or other device.

Despite the existence of many previously proposed fluid heat exchange systems, there remains a need for heat exchange systems configured to provide improved thermal performance. As well, there remains a need for systems configured for existing and developing small form factors, and more particularly to systems with modular and/or interchangeable components.

SUMMARY

Some fluid heat exchange systems described herein include an assembly of a fluid receiver unit, a fluid transfer unit, and a cold plate that are detachably engageable with each other. Such component heat exchange assemblies can be configurable or reconfigurable by permitting one or more of the assembly components to be replaced with a different version of the replaced assembly component. For example, one fluid receiver unit may include a pump assembly, and may be substituted by or for a different fluid receiver unit, e.g., having a more powerful pump assembly or no pump assembly at all according to an intended use. Similarly, one cold plate can be swapped out for a different cold plate to satisfy any number of design requirements (e.g., cooling capacity, cost, form factor) for a given system. The innovations disclosed herein overcome many problems in the prior art and address the aforementioned or other needs.

The innovations disclosed herein pertain generally to fluid heat exchange systems and associated component heat exchange assemblies, and more particularly, but not exclusively, to approaches for providing modular, interchangeable components in such systems and assemblies. As but one example, some innovations are directed to features of a housing for a fluid receiver unit and a housing for a fluid transfer unit that are so complementarily contoured relative to each other that the features, and thus the housings, are sealingly engageable with each other.

According a disclosed aspect, a modular heat exchange assembly includes a fluid receiver unit, a fluid transfer unit, and a cold plate. The fluid receiver unit can have a receiver housing defining an inlet port and a first fluid connector fluidically coupled with the inlet port. The first fluid connector can define a corresponding first aperture.

The fluid transfer unit can have a transfer housing defining an outlet port and a second fluid connector. The second fluid connector can define a corresponding second aperture and the second fluid connector can be matingly engageable with and disengageable from the first fluid connector to fluidly couple the first aperture and the second aperture together, defining a segment of a fluid passageway leading from the fluid receiver unit to the fluid transfer unit.

The cold plate can be coupled with the fluid transfer unit. The cold plate can define a finned surface having a plurality of microchannels. For example, the cold plate can define a plurality of fins and a corresponding plurality of microchannels between adjacent fins. Selected ones of the plurality of microchannels can extend from a first end to an opposed second end.

The fluid transfer unit can define a distribution manifold fluidically coupled with the second aperture and configured to distribute coolant received from the fluid passageway among the selected microchannels at a position between the first ends and the second ends of the microchannels. A collection manifold can be configured to receive coolant from the selected microchannels. The collection manifold and the outlet port can be fluidically coupled together.

The fluid receiver unit can include a pump having an inlet fluidically coupled with the inlet port and an outlet fluidically coupled with the first aperture of the first fluid connector.

The inlet port can be fluidically coupled with the first aperture of the first fluid connector.

The fluid receiver unit can define a pump volute having an inlet fluidically coupled with the inlet port and an outlet fluidically coupled with the first aperture of the first fluid connector.

The transfer housing can define a first major side and an opposed second major side. The first major side can define the second fluid connector and the second major side can define a recessed ceiling. The modular heat exchange assembly can also include a manifold insert defining a first major surface, an opposed second major surface defining the distribution manifold, and a fluid conduit extending through the manifold insert from the first major surface to the distribution manifold. The first major surface can mate with the recessed ceiling and the fluid conduit can fluidly couple with the fluid passageway leading from the fluid receiver unit to the fluid transfer unit.

The modular heat exchange assembly can also include a manifold plate overlying the finned surface. The manifold plate can define an aperture extending transversely relative to the plurality of fins. The manifold plate and the manifold insert can be matingly engageable with and separable from each other. In another embodiment, the manifold plate and the manifold insert are integrally formed together.

According to another aspect, a cold plate defines a finned surface with a corresponding plurality of microchannels. For example, the cold plate can define a plurality of fins and a corresponding plurality of microchannels positioned between adjacent fins. Selected ones (e.g., all or fewer than all) of the microchannels extend from a first end to an opposed second end. A fluid receiver unit defines an inlet port and a first fluid connector fluidically coupled with the inlet port. A fluid transfer unit defines an outlet port and a second fluid connector being matingly engageable with and disengageable from the first fluid connector to fluidly couple the fluid receiver unit and the fluid transfer unit together. The fluid transfer unit defines a distribution manifold configured to distribute coolant among the selected microchannels at a position between the first ends and the second ends of the microchannels. The fluid transfer unit also defines a collection manifold configured to receive coolant from the plurality of microchannels. The collection manifold and the outlet port are fluidically coupled with each other.

The fluid receiver unit can be positioned opposite the cold plate relative to the fluid transfer unit. The first fluid connector can define an aperture and the fluid receiver unit can define a mating surface facing the fluid transfer unit and extending around the aperture.

The fluid receiver unit can also define a plurality of wall segments. Each wall segment can extend partially around the aperture of the first fluid connector, defining a segmented wall. A portion of the mating surface can extend outwardly of the segmented wall and between adjacent wall segments.

The aperture can be a first aperture and the mating surface can be a first mating surface. The second fluid connector can define a corresponding second aperture and the fluid transfer unit can define a second mating surface corresponding to the first mating surface and extending around the second aperture. The first aperture and the second aperture can be aligned with each other when the fluid receiver unit and the fluid transfer unit are matingly engaged with each other.

A gasket can be positioned between the first mating surface and the second mating surface, sealing the fluid connection between the first fluid connector and the second fluid connector.

The fluid transfer unit can define a wall extending around a perimeter of the second aperture. The modular heat exchange assembly can also include a seal or other gasket positioned around the wall. The seal can urge against the first mating surface when the fluid receiver unit and the fluid transfer unit are matingly engaged with each other.

The wall defined by the fluid transfer unit can be a first wall. The fluid transfer unit can also define a second wall positioned outward of and extending around the first wall, defining a gap between the first wall and the second wall. The seal can be positioned in the gap.

The second wall can include an end region and an end face. The end face can define a portion of the second mating surface. The fluid receiver unit can also define a plurality of wall segments. Each wall segment can extend partially around the aperture of the first fluid connector to define a segmented wall around the aperture of the first fluid connector. The segmented wall can extend around the portion of the second mating surface defined by the end face and can overlap with the end region of the second wall when the fluid receiver unit and the fluid transfer unit are matingly engaged with each other.

The portion of the second mating surface defined by the end face of the second wall can be a first portion of the second mating surface. The fluid transfer unit can define a rib extending outward of the second wall, the rib defining a second portion of the second mating surface. A portion of the first mating surface can extend between adjacent wall segments outwardly of the segmented wall. The portion of the first mating surface can face the second portion of the second mating surface when the fluid receiver unit and the fluid transfer unit are matingly engaged with each other.

The fluid receiver unit can define a wall extending around a perimeter of the first aperture. The modular heat exchange assembly can also include a seal positioned around the wall. The seal can urge against the second mating surface when the fluid receiver unit and the fluid transfer unit are matingly engaged with each other.

The wall defined by the fluid receiver unit can be a first wall. The fluid receiver unit can define a second wall positioned outward of and extending around the first wall defining a gap between the first wall and the second wall. The seal can be positioned in the gap.

The second wall can have an end region and an end face. The end face can define a portion of the first mating surface. The fluid transfer unit can also define a plurality of wall segments. Each wall segment can extend partially around the second aperture to define a segmented wall around the second aperture. The segmented wall can extend around the portion of the first mating surface defined by the end face and can overlap with the end region of the second wall when the fluid receiver unit and the fluid transfer unit are matingly engaged with each other.

The portion of the first mating surface defined by the end face of the second wall can be a first portion of the first mating surface. The fluid receiver unit can define a rib extending outward of the second wall. The rib can define a second portion of the first mating surface. A portion of the second mating surface can extend between adjacent wall segments outwardly of the segmented wall. The portion of the second mating surface can face the second portion of the first mating surface when the fluid receiver unit and the fluid transfer unit are matingly engaged with each other.

The fluid receiver unit can define a pump volute. The fluid receiver can define a fluid conduit fluidically coupling the inlet port with the first fluid connector.

It is to be understood that other innovative aspects will become readily apparent to those skilled in the art from the following detailed description, wherein various embodiments are shown and described by way of illustration. As will be realized, other and different embodiments are possible and several details are capable of modification in various other respects, all without departing from the spirit and scope of the principles disclosed herein.

Accordingly, the drawings and detailed description are to be regarded as illustrative in nature and not as restrictive.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

DETAILED DESCRIPTION

Figure 1:
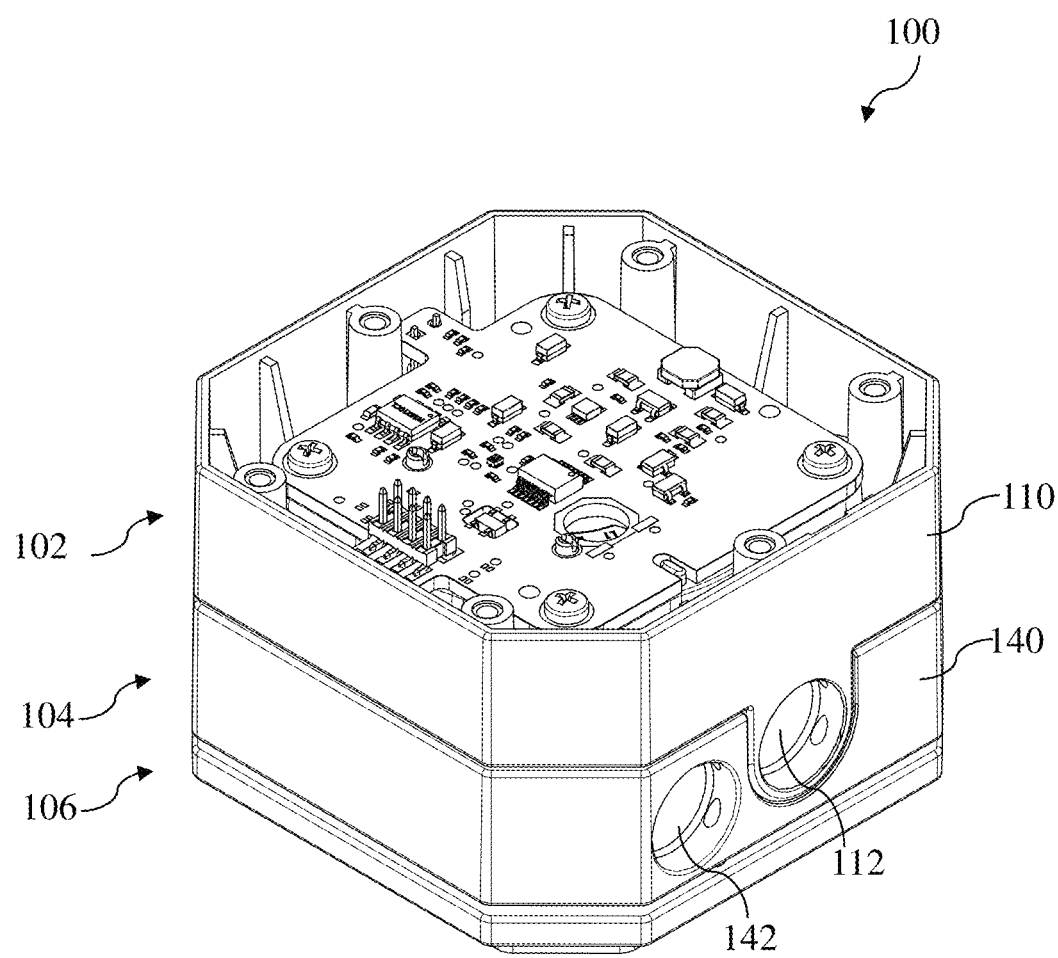
FIG. 1 shows an isometric view of a modular component heat exchange assembly having a fluid receiver unit and a fluid transfer unit coupled together.

The following describes various innovative principles related to modular heat exchange systems by way of reference to specific examples. However, one or more of the disclosed principles can be incorporated in various system configurations to achieve any of a variety of corresponding system characteristics. The detailed description set forth below in connection with the appended drawings is intended as a description of various embodiments and is not intended to represent the only embodiments contemplated by the inventor. The detailed description includes specific details for the purpose of providing a comprehensive understanding of the principles disclosed herein. However, it will be apparent to those skilled in the art after reviewing this disclosure that one or more of the claimed inventions may be practiced without one or more of the illustrated details.

Stated differently, systems described in relation to particular configurations, applications, or uses, are merely examples of systems incorporating one or more of the innovative principles disclosed herein and are used to illustrate one or more innovative aspects of the disclosed principles. Thus, modular heat exchange systems having attributes that are different from those specific examples discussed herein can embody one or more of the innovative principles, and can be used in applications not described herein in detail, for example to transfer heat to or from components in a data center, laser components, light-emitting diodes, chemical reactions, photovoltaic cells, solar collectors, electronic components, power electronics, optoelectronics (e.g., used in switches) and a variety of other industrial, military and consumer devices now known or hereafter developed. Accordingly, such alternative embodiments also fall within the scope of this disclosure.

I. Overview

A fluid heat exchange system can have a fluid circuit that includes a component heat exchange assembly configured to thermally couple with a heat source, such as for example a computer processor. The component heat exchange assembly can be configured to absorb heat from the heat source and to transfer the heat to a liquid coolant passing through the component heat exchange assembly. A conduit can convey the heated liquid to a second heat exchanger configured to reject heat from the liquid to another medium, such as, for example, atmospheric air or another cooling liquid (e.g., facility water) that carries the rejected heat to an ultimate heat sink (e.g., the atmosphere or the earth). A pump may circulate the fluid throughout the fluid circuit, and the fluid circuit may include more than one component heat exchange assembly.

For instance, the fluid heat exchange system may be designed to cool a single processor of a single computer system. In this embodiment, the fluid heat exchange system can include but one component heat exchange assembly. In another embodiment, a fluid heat exchange system can be installed in a rack of servers (or more than one rack of servers). In this other embodiment, the fluid heat exchange system can include a plurality of component heat exchange assemblies. U.S. Pat. No. 9,496,200 (hereby incorporated by reference in its entirety for all purposes) describes fluid heat exchange systems having a plurality of component heat exchange modules. U.S. Pat. No. 9,453,691 (hereby incorporated by reference in its entirety for all purposes) describes embodiments of component heat exchange modules.

Some component heat exchange assemblies include an integrated pump and others do not. As an example, a component heat exchange assembly that incorporates an integrated pump may be substituted for a component heat exchange module that has an integrated pump as described in the '200 patent and the '691 patent. U.S. Pat. No. 8,746,330 (hereby incorporated by reference in its entirety for all purposes) describes a fluid heat exchanger that does not include a pump. As another example, a component heat exchange assembly that does not incorporate an integrated pump may be substituted for fluid heat exchanger as described in the '330 patent A manufacturer or other supplier of fluid heat exchange systems or components typically faces a variety of cooling and other requirements from its customers. For example, one customer's computer system may require more or less cooling than another customer's computer system, or one rack of servers may be less populated or have a lower capacity than another rack of servers. Accordingly, the manufacturer or supplier may wish to select one from among a variety of standard pumps (or no pump) to combine with one of a variety of standard cold plates to tailor the cooling capacity or pump performance to the requirements of the system in which the component heat exchange assembly will be used. By selecting from standardized parts and assembling the selected parts into a component heat exchange module, overall costs can be reduced compared to bespoke designs while maintaining flexibility to tailor cooling and fluid delivery capacities to each customer's needs.

Accordingly, modular heat exchange systems are described herein that provide separate, matingly engageable and disengageable units that permit component heat exchange modules to be reconfigured with different pumps (or no pump) and cold plates independently of each other.

As used herein, "fluidic" means of or pertaining to a fluid (e.g., a gas, a liquid, a mixture of a liquid phase and a gas phase, etc.). Thus, two regions that are "fluidically coupled" are so coupled to each other as to permit a fluid to flow from one of the regions to the other region in response to a pressure gradient between the regions.

As used herein, the terms "working fluid" and "coolant" are interchangeable. Although many formulations of working fluids are possible, common formulations include distilled water, ethylene glycol, propylene glycol, and mixtures thereof.

As used herein, the terms "heat sink" and "cold plate" are interchangeable and mean a device configured to transfer energy to a fluid from a device that dissipates heat (or from a fluid to a device that absorbs heat) through convection (i.e., a combination of conduction and advection) heat transfer.

II. Modular Heat Exchange System Example

With reference to FIGS. 1 to 8, aspects of a modular component heat exchange assembly 100 are described. Modular heat exchange assembly 100 includes a fluid receiver unit 102, a fluid transfer unit 104, and a cold plate unit 106. Fluid receiver unit 102 has a receiver housing 110, which may define an inlet port 112. Fluid transfer unit 104 has a transfer housing 140, which may define an outlet port 142. The housing 110 of the fluid receiver 102 may have one or more structures that correspond to one or more complementary structures defined by the housing 140 of the fluid transfer unit 104, permitting the two units 102, 104 to be coupled together, e.g., fluidically coupled together. In some embodiments, the units 102, 104 can also be removably coupled with each other (e.g., may be disengageable from each other after being assembled together). Similarly, the housing 140 may have one or more structures that correspond to one or more complementary structures defined by the cold plate unit 106, permitting the fluid transfer unit 104 and the cold plate unit 106 to be fluidically coupled together.

As shown in FIG. 1, the fluid receiver unit 102 and fluid transfer unit 104 are coupled with each other, and the cold plate unit 106 is coupled with the transfer unit 104. When so coupled, the inlet port 112 and the outlet port 142 may be fluidically coupled with each other such that fluid entering the assembly 100 at the inlet port 112 can exit the system 100 at the outlet port 142, after passing along one or more internal fluid passageways defined by the assembled component heat exchange assembly 100. The one or more internal fluid passageways can include a plurality of microchannels defined by the cold plate unit 106 where heat transfer occurs.

The receiver housing 110 and the transfer housing 140, or both, may be formed using, for example, a molding technique (e.g., injection molding, compression molding, transfer molding), a 3-D printing technique, an extrusion technique, a machining technique, or other suitable process now known or hereafter developed. The housings 110, 140, or both may be made from one or more materials that provide a sufficiently rigid structure to resist structural deformation under operating conditions and that resist thermal expansions and contractions that could loosen fluidic connections and/or cause leakage. For example, common materials from which an injection-molded housing can be formed include polyphenylene sulfide (commonly referred to as "PPS"), polytetrafluoroethylene (commonly referred to as "PTFE" or the trade name TEFLON by the DuPont Company), and acrylonitrile butadiene styrene (commonly referred to as "ABS").

Figure 2:
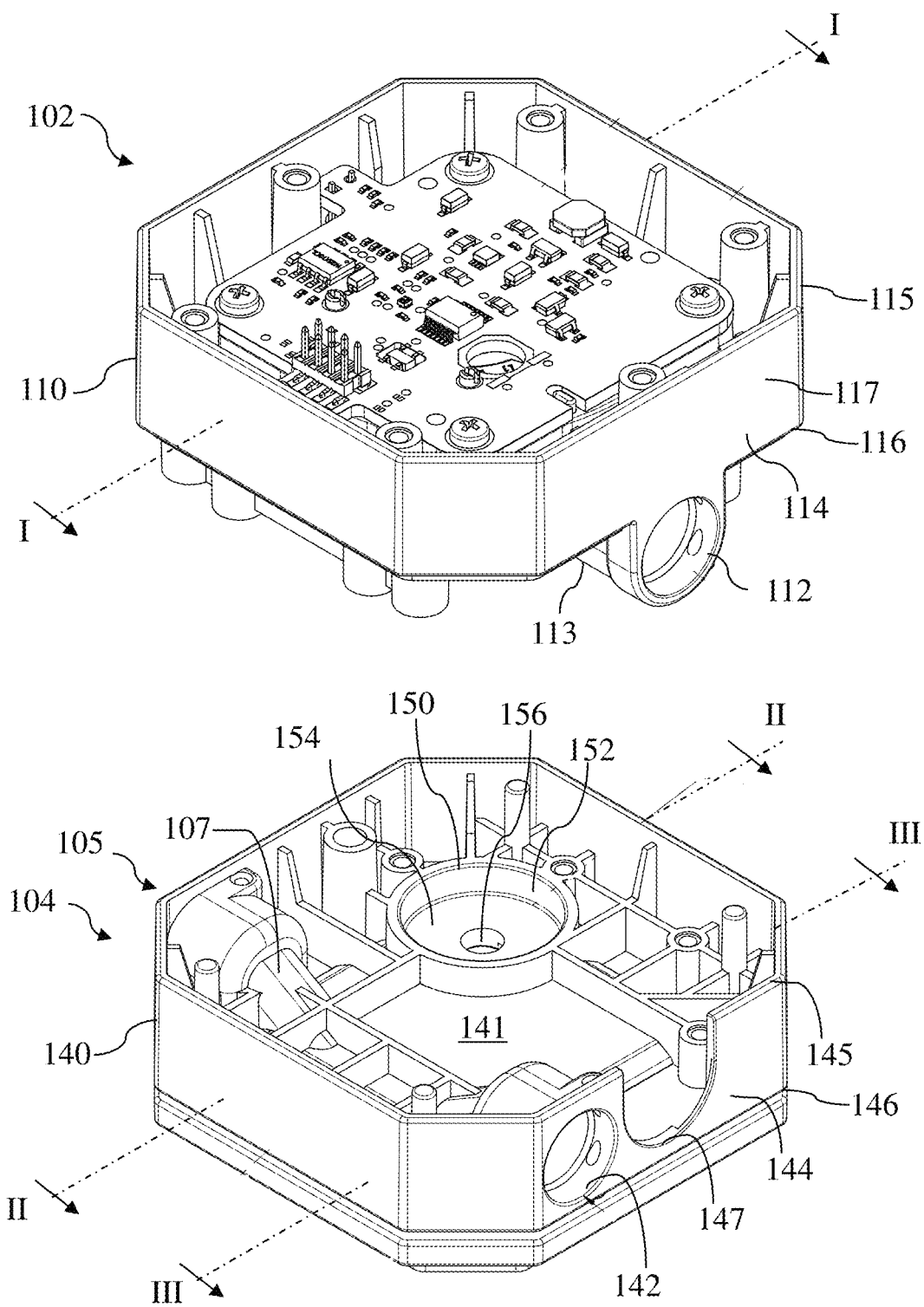
FIG. 2 shows an isometric exploded view of the modular component heat exchange assembly shown in FIG. 1.

In the exploded view of FIG. 2, fluid receiver unit 102 is shown decoupled from fluid transfer unit 104. In one example, the receiver housing 110 may define a perimeter wall 114. As depicted, the perimeter wall 114 has eight sides, though the perimeter wall may have more or fewer sides. Other perimeter shapes are possible, for example, the receiver perimeter wall may be cylindrical or elliptical, or may have three or more sides. A perimeter wall having a polygonal perimeter may have planar sides of equal perimeter-segment length, or sides that differ in perimeter-segment length. A perimeter wall may have one or more curved sides.

The perimeter wall 114 of the receiver housing 110 may define a first perimeter edge 115 and a second perimeter edge 116. As shown in FIG. 2, the first perimeter edge 115 can be parallel to the second perimeter edge 116. For purposes of discussion, the first perimeter edge 115 will be referred to as a "top edge" of wall 114, and the second perimeter edge 116 will be referred to as a "bottom edge" of the wall 114. The inlet port 112 may lie in a common plane with the bottom edge, extending away from, e.g., below, the bottom edge 116. In the illustrated embodiment, a face of the inlet port 112 is co-planar with a side 117 of the perimeter wall 114, though the face of the inlet port can be recessed from the perimeter wall or be positioned outwardly of the perimeter wall. The inlet port 112 may be fluidically coupled to an inlet conduit 113 extending inwardly from the inlet port, e.g., inwardly of the side 117. The inlet conduit 113 may be disposed partly below an elevation of the second perimeter edge 116.

Similar to the receiver housing 110, the transfer housing 140 can define a perimeter wall 144. The perimeter wall 144 of the transfer housing may have the same perimeter shape as the perimeter wall 114 of the receiver, e.g., eight sides as shown in FIGS. 1 and 2. The transfer perimeter wall 144 may have a different perimeter shape than the receiver perimeter wall 114, provided that the two perimeter walls permit the transfer housing 140 and the receiver housing 110 to be coupled together (or at least do not prevent them from being coupled together).

The transfer perimeter wall 144 may define a third (upper) perimeter edge 145 and a fourth (lower) perimeter edge 146. For purposes of discussion, the third perimeter edge 145 will be referred to as the "top edge" of wall 144, and the fourth perimeter edge 146 will be referred to as the "bottom edge" of wall 144. The outlet port 142 may be disposed in the transfer perimeter wall 144, for example, an aperture opening from one face of the wall 144 between the top and bottom edges 145, 146 of the perimeter wall. The upper edge 145 of the perimeter wall 144 can define a recess 147 having a complementary contour relative to the wall of the inlet port 112 and/or the inlet conduit 113. For example, the recess 147 may be sized and shaped to receive the inlet port 112 when the transfer housing 140 and the receiver housing 110 are coupled together. When so coupled together, the lower edge 116 of the perimeter wall 114 defined by the receiver housing 110 can contact the upper edge 145 of the perimeter wall 144 defined by the transfer housing 140. In an embodiment, the upper edge 145 and the lower edge 116 matingly engage with each other, as by a tongue (not shown) defined by one of the edges mating with a corresponding groove defined (not shown) by the other of the edges.

The transfer housing 140 can define a first major surface bounded by the upper edge 145 of the perimeter wall 144.

Figure 5:
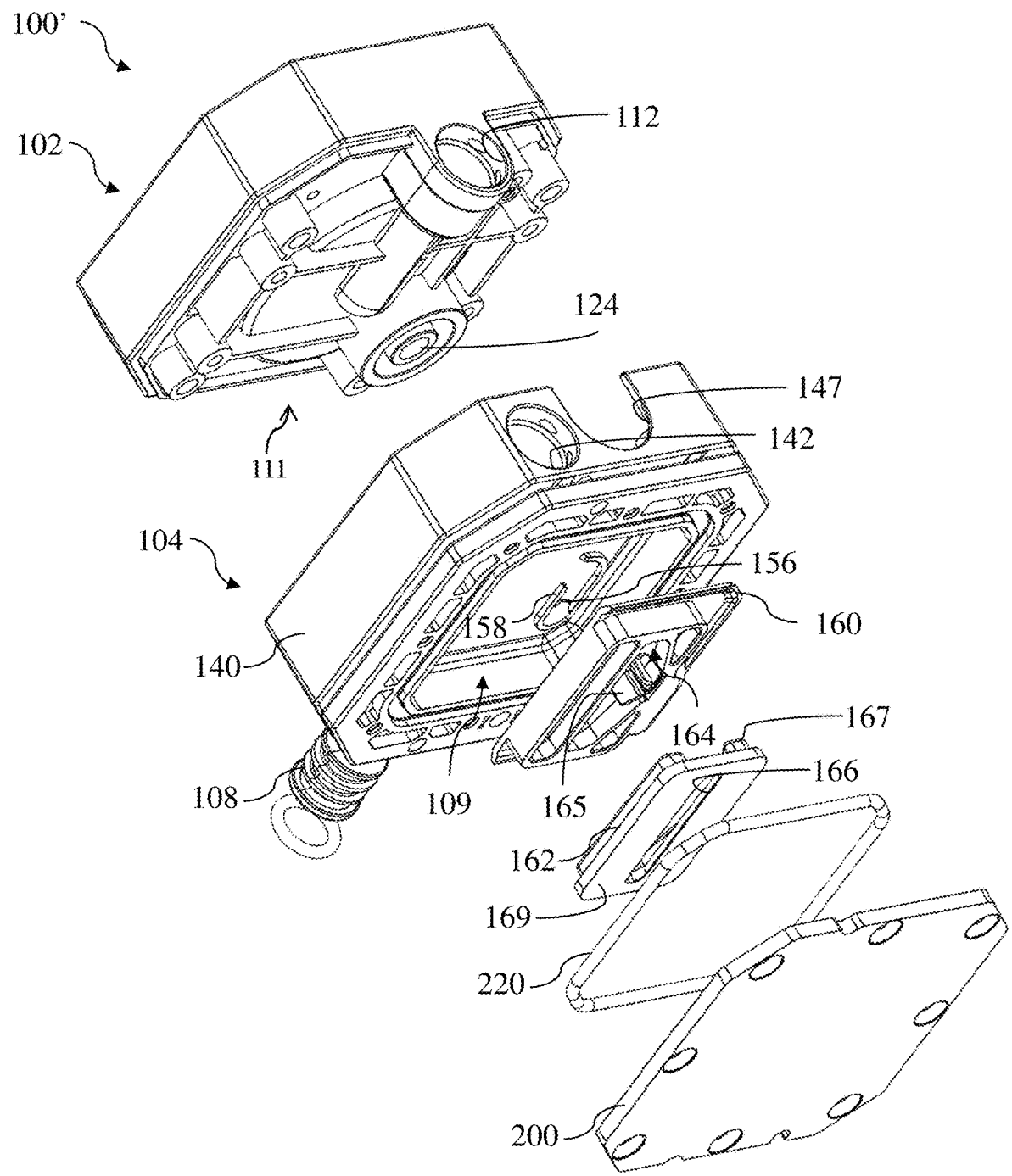
FIG. 5 shows an exploded isometric view from below the portion of the component heat exchange assembly shown in FIG. 4.

The first major surface in turn can define a coupling region 141. The coupling region 141 can include a fluid connector 150 configured to detachably and matingly engage with a complementary structure defined by a corresponding region of the receiver housing 110 positioned opposite the coupling region 141 when the receiver housing 110 and the transfer housing 140 are brought into an opposing relationship, as shown in FIG. 2. For example, the fluid connector 150 may define a recessed region circumscribed by a support wall 152. The support wall 152 may be cylindrical as shown, although other shapes are possible. The recessed region of the fluid connector 150 can have a floor 154. In turn, the floor 154 may define an aperture, or port, 156. The port 156 can extend through the floor 154, and in some embodiments, through coupling region 141 to fluidically couple with an internal conduit or other fluid passage defined by the fluid transfer unit 104. The fluid connector aperture 156 may be centrally positioned on the floor 154 or may be positioned off-center as depicted in FIG. 5.

In one example, the floor 154 may be downwardly sloped (e.g., concave) as observed moving from the support wall 152 toward the aperture 156, e.g., the floor adjacent the aperture may be more deeply recessed from the upper edge 145 of the perimeter wall 144 than the floor adjacent the support wall 152. In another example, the floor 154 may be upwardly sloped (e.g., convex) as observed moving from the support wall 152 toward the aperture 156. In yet another example, the floor 154 may be flat, e.g., may be uniformly recessed from the upper edge 145 of the perimeter wall. As described more fully below in relation to FIG. 4, the fluid connector 150 can define an inlet to the fluid transfer unit 104 configured to receive fluid from the fluid receiver unit 102. For example, the fluid connector 150 may be fluidically coupled with a corresponding outlet connector 120 (FIG. 3) defined by the fluid receiver unit 102, allowing the fluid transfer unit 104 to receive fluid from the fluid receiver unit 102 when the receiver housing 110 and the transfer housing 140 are coupled together as shown in FIG. 1.

The receiver housing 110 and the transfer housing 140 may further be configured to be retained together when coupled with each other, and to be separable or otherwise detachable from each other after being coupled with each other. For example, the housings 110 and 140 may include internal structures such as through-holes and shafts (or recesses and corresponding bosses) that permit fastening members such as screws or bolts to removably connect one housing to the other. In another example, the housings 110 and 140 may include complementary structures that engage, e.g., interlock, with each other to secure one housing to the other when the complementary structures or brought together or otherwise joined, and to subsequently disengage from each other. For example, the housings can matingly engage with each other using complementarily configured features, such as for example studs and sockets, or compression fittings, and can be separated from each other, similar to Lego® building blocks can be matingly engaged with each other and subsequently disengaged from each other. The receiver housing 110 and transfer housing 140 may be further secured together for example, with fasteners (e.g., screws), clasps, clamps, strapping or other mechanisms to enhance the mating engagement between the housings and to prevent them from detaching from each other. Further, as shown by way of example in FIGS. 2 through 6, the housings 110, 140 can define complementary fluid connectors 120, 150 that can blindly mate with each other when the fluid receiver unit 102 and fluid transfer unit 104 are coupled together as shown in FIG. 1. For example, the fluid connector 150 has a floor 154 (FIG. 2) defining a face seal that abuts the opposed faces of the outer support wall 122 and the inner wall 126 (FIG. 3) to provide a fluidic connection between the fluid connector 120, 150. Alternative embodiments of blindly matable fluid connectors are shown in and described in relation to FIGS. 20 through 23, below. For example, in the alternative embodiment, the fluid connector of the fluid receiver unit 1602 (FIG. 20) defines a face seal similar to the fluid connector 150 defined by the transfer unit 104, whereas the fluid connector of the fluid transfer unit 1604 (FIG. 21) is similar to the fluid connector 120 defined by the receiver unit 102 (e.g., has concentric walls separated by an annular gap).

Figure 3:
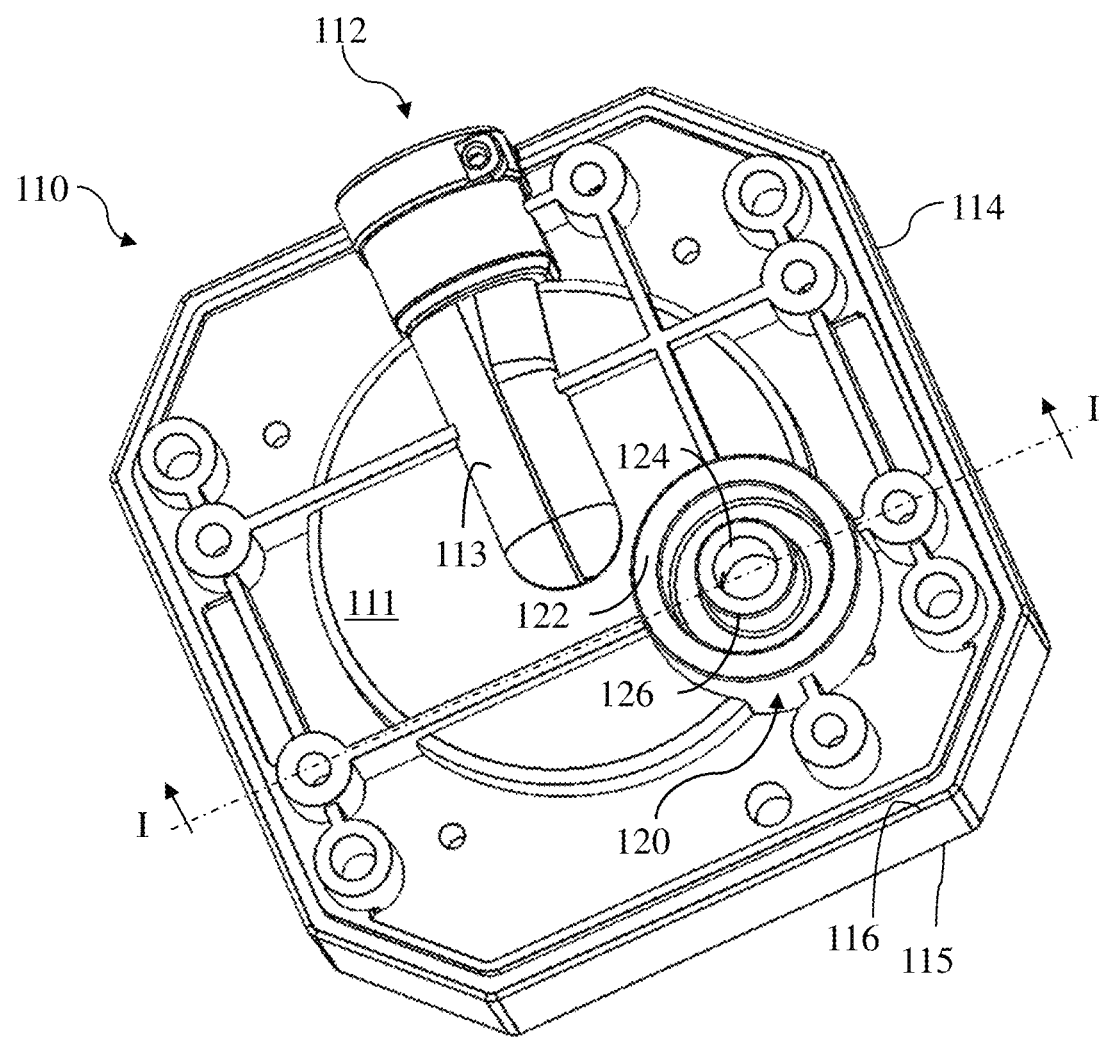
FIG. 3 shows an isometric view from below the fluid receiver unit shown in FIGS. 1 and 2.

Referring now to FIG. 3, an isometric view from below the receiver housing 110 reveals the fluid connector 120 (e.g., an outlet connector of the fluid receiver unit 102).

The receiver housing 110 defines a receiver coupling region 111 that may be partially recessed from the bottom edges 116 of the perimeter wall 114, or may partially protrude beyond the bottom edges, as depicted in the isometric, exploded view shown in FIG. 5. A portion of the inlet port 112 and the conduit 113 may protrude or protrude beyond the receiver coupling region 111 relative to the bottom edges 116.

Receiver coupling region 111 (which defines a major surface opposite the floor of the pump volute 131) may define a portion of the fluid connector 120. The fluid connector 120 may be configured to be matingly engageable and disengageable with the fluid connector 150 (FIG. 2) defined by the transfer housing 140. For example, the fluid connector 120 may include an outer support wall 122 that may be insertable within the recessed region circumferentially bounded by the support wall 152 of the fluid connector 150. The outer diameter (or perimeter) of the support wall 122 may be slightly smaller than an inner diameter (or perimeter) of the support wall 152. Alternatively, the support wall 152 of the fluid connector 150 may be insertable into the support wall 122 of the fluid connector 120. The support wall 122 may, for example, function as a stud and the support wall 152 may function as a socket, similar to a snap closure. Further, the walls 122 and 152 may define complementary tapers, as to enhance sealing of a press-fit engagement between the walls. Alternatively, the walls 122 and 152 may be vertically oriented without a taper and sized to permit a sliding engagement between the walls, allowing the floor 154 of the connector 150 to sealingly abut a corresponding face of the wall 122 and inner wall 126.

As noted, the fluid connector 120 may also include an inner wall 126. The inner wall 126 may be concentric with the support wall 122 and may extend below and away from the fluid connector aperture 124, perpendicularly to the receiver coupling region 111. The inner wall 126 may function as a pipe or conduit leading from the fluid connector aperture 124 to the fluid connector aperture 156.

Although the description above refers generally to aperture 124 as being centrally located relative to, for example, walls 126, 122 and aperture 156 as being centrally located relative to, for example, wall 152, one or both apertures 124, 156 may be positioned off-center relative to such walls. Further, the walls 122, 126, 154 shown in the illustrations are described as being annular or cylindrical, but perimeter walls having other cross-sectional shapes are possible, as will be understood following a review of this disclosure by a person having ordinary skill in the art. For example, the walls may have an irregular cross-sectional shape (e.g., a wall thickness may vary with position or an outer surface of the wall may have a sinuous or other irregular contour, or both), a quadrilateral cross-sectional shape, an ellipsoidal cross-sectional shape, etc.

Further, an annular static seal or other gasket (not shown) can be positioned within the annular recess between the wall 122 and the inner wall 126 and can extend beyond the end faces of the walls 122, 126. In an embodiment, an end face of such a seal or gasket can abut the floor 154 of the connector 150, compressing the seal or gasket between the floor of the annular recess and the floor 154 to cause the seal or gasket to swell radially and enhance sealing performance of the fluid connection provided by the connectors 120, 150.

In an embodiment, the fluid connector 150 defines an annular wall extending circumferentially around and coaxially with the aperture 156. Such an annular wall can be received in the annular gap defined between the walls 122, 126 of the connector 120. A seal or other gasket positioned within the annular gap between the walls 122, 126 can be captured between an end face of the annular wall defined by the connector 150 and a floor of the annular gap between the walls 122, 126. Compression of the seal or other gasket between the end face of the connector 150's annular wall and the connector 120's annular floor can cause the seal or other gasket to swell radially and enhance sealing performance of the fluid connection provided by the connectors 120, 150. Moreover, placing the annular wall of the connector 150 within the annular gap of the connector 120 can facilitate alignment of the receiver housing with the transfer housing. Although the connector 120 is described as defining an annular gap and the connector 150 is described as defining an annular wall, the connector 120 can define an annular wall received within an annular gap defined by the connector 150. In a further example, both connectors can define an annular wall and an annular gap so that on mating, the connectors 120 and 150 having annular walls interleaved or juxtaposed with each other. A seal or other gasket as described above can be positioned within each annular gap of a connector that receives a complementary annular wall of the other connector.

Although seals or gaskets that abut a floor of an annular gap and an end face of an annular wall are described, a seal or a gasket can extend between a longitudinal face of an annular wall of one connector (120 or 150) and a corresponding, opposed longitudinal face of the other connector (150 or 120). For example, an O-ring can extend around an outer surface of an inner wall and urge radially outwardly against an inner surface of an outer wall. Alternatively, an O-ring can extend circumferentially around an inner surface of an outer wall (as when seated in a circumferential groove) and urge radially inwardly against an outer surface of the inner wall.

Receiver coupling region 111 may define a fluid connector aperture (or port) 124 disposed radially inward of the support wall 122. The port 124 fluidically couples with the outlet port 124a from the pump volute 131 (FIG. 4), providing a fluid passage from the pump volute to the fluid connector 120. The fluid connector aperture 124 may be positioned centrally with respect to the support wall 122 or may be positioned off-center. When fluid connector 120 is matingly engaged with the fluid connector 150, the fluid connector aperture 124 may be concentrically aligned with the fluid connector aperture (or inlet port) 156 to the transfer unit 104. Alternatively, the fluid connector apertures 124 and 156 may be fluidically coupled together, for example, by a separate fluid conduit (not shown), without being concentrically aligned with each other. When matingly engaged with each other, the fluid connectors 120 and 150 may define a fluidically sealed transfer plenum, or conduit, extending along the inner wall 126 through the opening 124 and into the aperture 156 defined by the floor 154.

Figure 4:
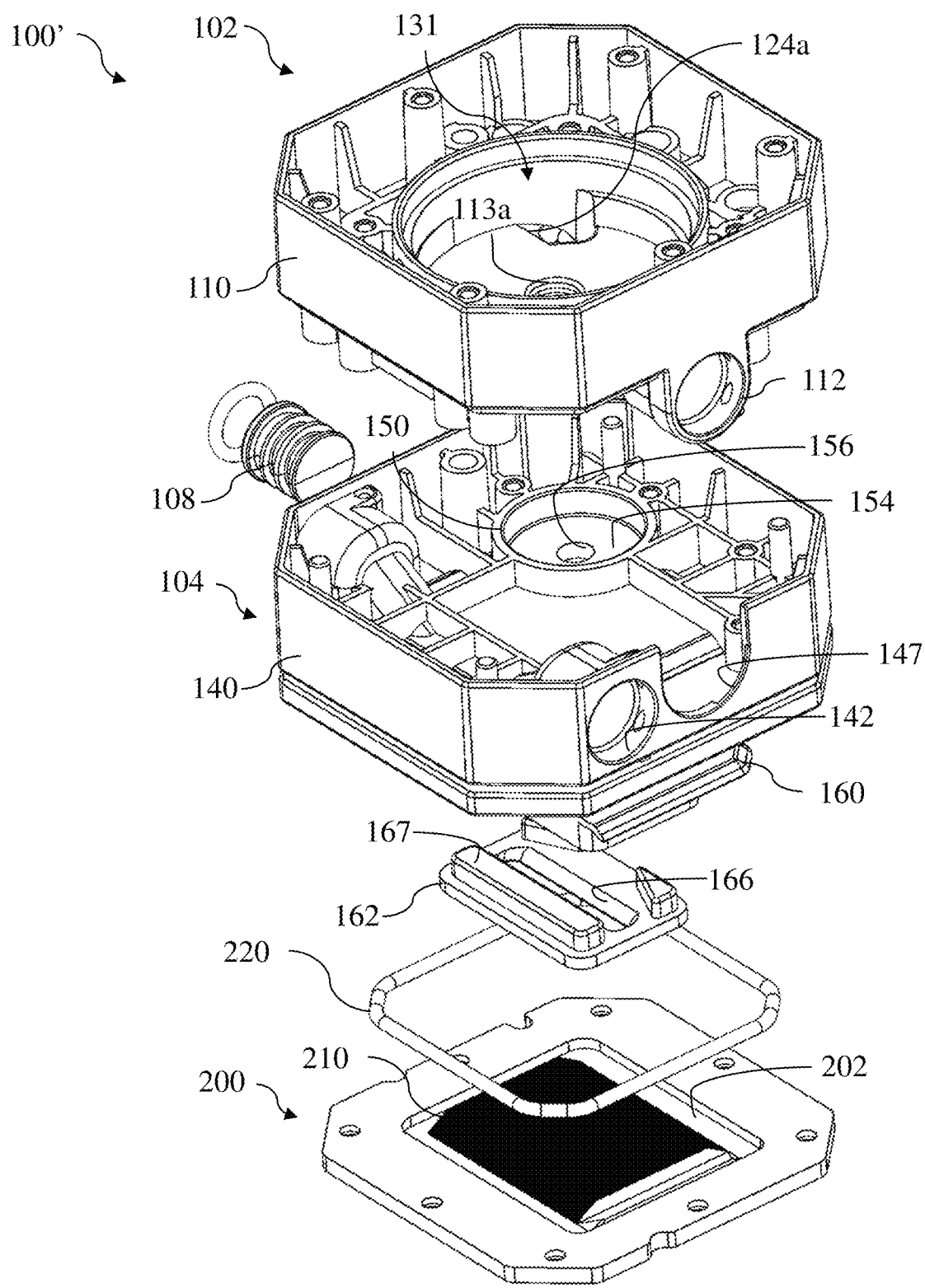
FIG. 4 shows an exploded isometric view from above a portion of the component heat exchange assembly shown in FIG. 1.

FIG. 4 shows a partial exploded view 100' of the modular heat exchange assembly 100 shown in FIG. 1 (omitting several pump components and control components, as well as a housing top cap to reveal details of the pump volute 131). In FIG. 4, the pump volute 131 is defined by a recess from a first side of the fluid receiver unit 102. The pump volute 131 receives coolant delivered to the inlet port 112 by way of the conduit 113 that extends from the inlet port 112 (i.e., the inlet to the receiver unit 102) to the inlet 113a to the pump volute. The pump volute 131, in turn, defines a cut water having an outlet port 124a that extends through the floor of the volute and opens to the aperture 124 (the outlet port from the receiver unit 102) defined by the inner wall of the fluid connector 120 (FIG. 3). As shown, the outlet port 124a is positioned radially outward of an inlet 113a to the pump volute. The fluid connector 120 is similarly radially offset from a center of the pump volute (albeit on a second side of the housing 110 opposite the first side that defines the pump volute 131).

As also shown in FIG. 4, the fluid transfer unit 104 may also include a charge port, e.g., charge port 105. The charge port 105 (FIG. 2) can extend through the perimeter wall 144 of the fluid transfer unit and a conduit 107 can extend inwardly of the perimeter wall, coupling the charge port 105 with a recessed region 109 or other fluid passage (FIG. 5) formed under the transfer housing 140 (e.g., at an elevation between the coupling region 141 and the lower edge 146 of the perimeter wall 144), allowing an assembled heat exchange system to be charged with a working fluid after assembly. After charging, a plug (e.g., plug 108 (FIG. 4)) can be inserted into the charge port 105 to seal it. One or more (e.g., two) O-rings can extend circumferentially around the plug and urge against the inner surface of the charge port 105, providing a sealing engagement between the plug and the charge port. The charge port 105 and an associated conduit 107 fluidically coupled with a fluid passage may alternatively be defined by the fluid receiver unit 102.

III. Manifold Inserts and Cold Plates

Referring still to FIG. 5, a side of the fluid transfer unit 104 opposite the coupling region 141 (FIG. 2) may define a recess 109. Within the recess 109, a wall 158, or lip, extends from the ceiling of the recess and around the aperture 156 opening from the fluid connector 150 (FIG. 4). The recess 109 can receive the manifold insert 160.

Figure 6:
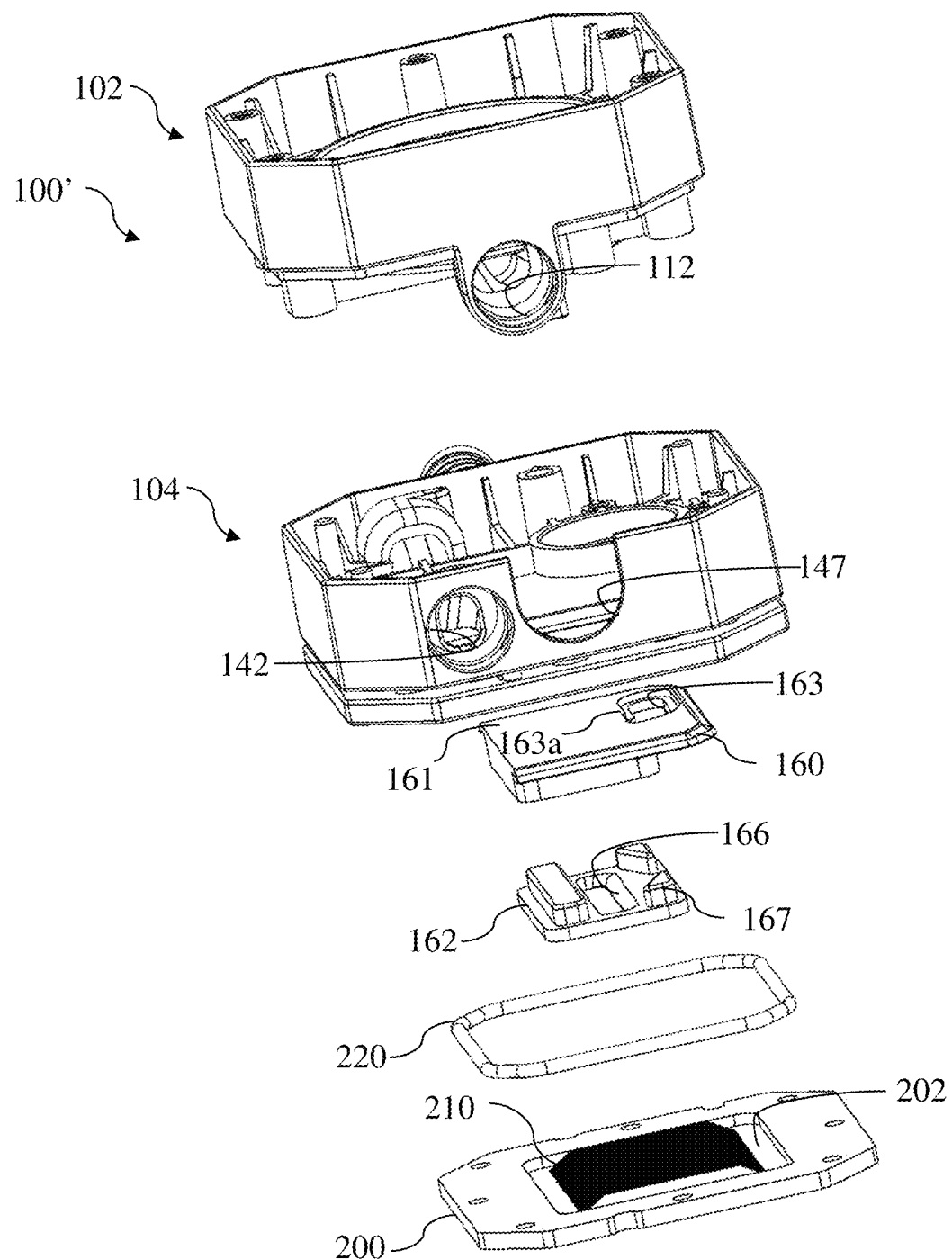
FIG. 6 shows another exploded isometric view of the component heat exchange assembly shown in FIG. 4.

As shown in FIG. 6, the manifold insert 160 can define a fluid conduit 163 opening from a first major surface 161 of the insert, which faces opposite the ceiling of the recess 109 defined by the fluid transfer unit 104. Further, a recessed region 163a around a perimeter of the fluid conduit 163 can be recessed from the first major surface 161. When the inert 160 is positioned within the recess 109 (FIG. 5) with the first major surface 161 facing the ceiling of the recess 109, the perimeter wall 158 mates with the recess 163a, aligning the inlet to the fluid conduit 163 with the aperture 156, fluidically coupling the conduit 163 with the fluid connector 150.

Thus, fluid exiting the fluid receiver unit 102 via the aperture 124 may enter the fluid transfer unit 104 at the fluid connector 150, flow through the aperture 156, and enter the conduit 163. As FIG. 5 shows, the conduit 163 can be a passageway configured to convey fluid from the aperture 156 to a distribution manifold 164 at a second end. In the embodiment shown in FIG. 5, the distribution manifold 164 can include one or more turning vanes 165 configured to distribute fluid from the conduit 163 throughout the distribution manifold 164. The turning vanes 165 may be planar structures oriented at a selected angle of attack relative to an incoming flow through the conduit 163, causing fluid entering the manifold chamber 164 to spread or fan outwardly of the conduit.

Figure 8:
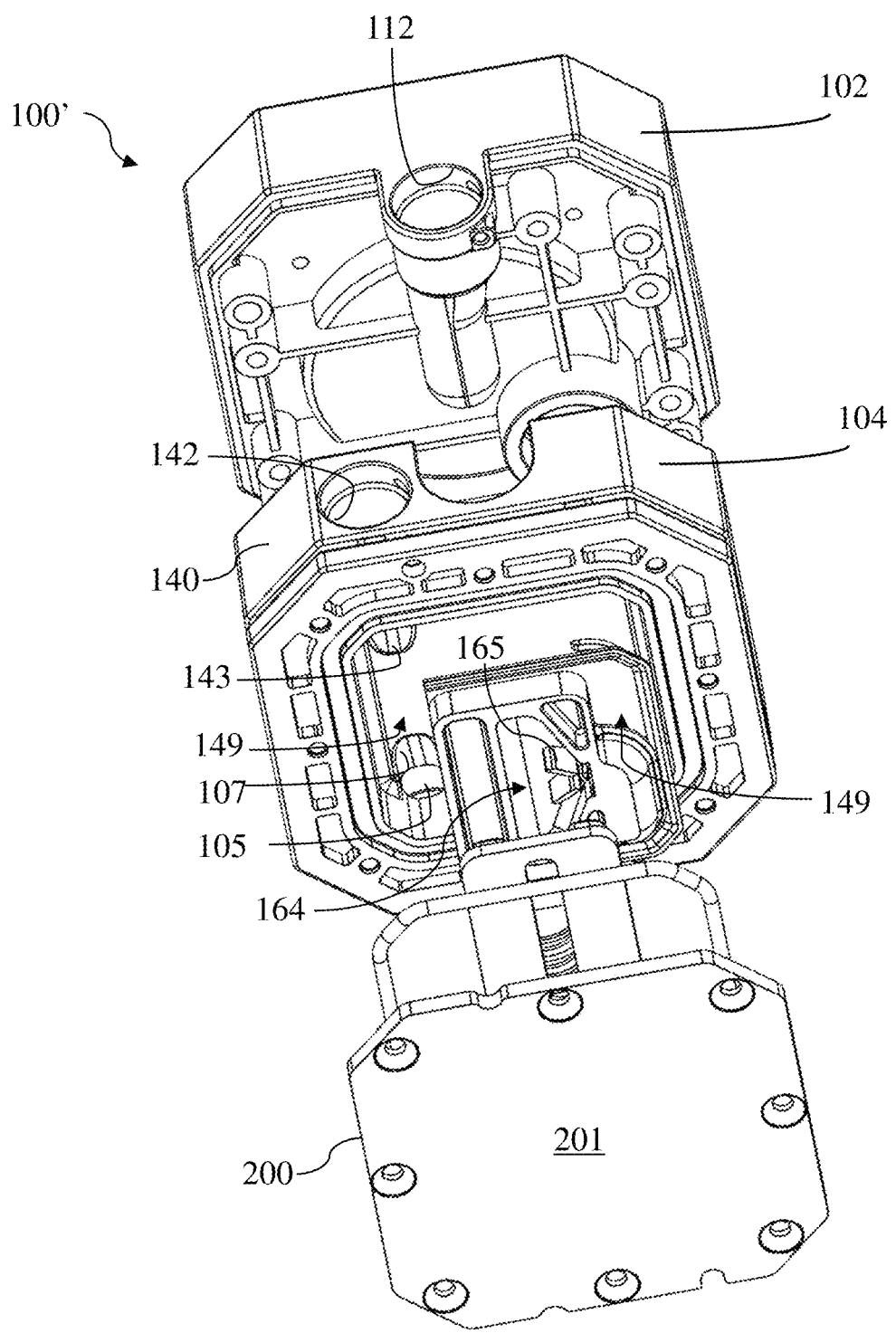
FIG. 8 shows another exploded isometric view of the component heat exchange assembly shown in FIG. 4.

From the distribution manifold 164, the fluid can then flow through a manifold aperture 166 defined by the compliant member 162. As shown in FIG. 5, the manifold chamber 164 may be covered (e.g., partially closed) by the first major surface 161 positioned opposite the manifold aperture 166. The turning vanes 151 may extend downwardly from the first major surface 161 into the manifold chamber 164, as depicted in FIG. 8.

As shown in FIG. 6, the compliant member 162 may include one or more bosses 167 configured to be positioned within a corresponding recessed region or aperture 168 defined by the insert 160, allowing the manifold insert 160 to matingly engage with the compliant member 162.

As shown in FIG. 1, the component heat exchange assembly 100 can include a cold plate unit 106 positioned opposite the fluid receiver unit 102 relative to the fluid transfer unit 104. The cold plate unit 106 can include a cold plate 200 (or heat sink). According to an embodiment, the cold plate 200 may include a thermally conductive heat spreader plate having an inner facing, upper surface 202 and a plurality of juxtaposed fins 210 extending generally perpendicularly from the upper surface. Opposite the upper surface 202, the cold plate can define a thermal contact surface 201 (FIG. 8) configured to be placed in thermal contact with a heat-dissipating device, e.g., a processor.

The fins 210 may be thermally coupled to the upper surface 202 to accept thermal energy conducted from the thermal contact surface 201, through the heat spreader plate, to the upper surface 202. The fins 210 may define a corresponding plurality of parallel microchannels between adjacent fins. The microchannels are formed to accept and allow passage therethrough a flow of working fluid such that the fluid can move along the heat spreader plate and fins 210 and receive heat energy from them. The channel area, defined between upper surface 202 and the fins 210, channels or directs fluid to define a fluid flow path. The channel area may be open or filled with thermally conductive porous material such as for example metal or silicon foam, sintered metal, etc. Thermally conductive, porous materials allow flow through the channels but create a tortuous flow path having a large surface area available for heat transfer.

Figure 16:
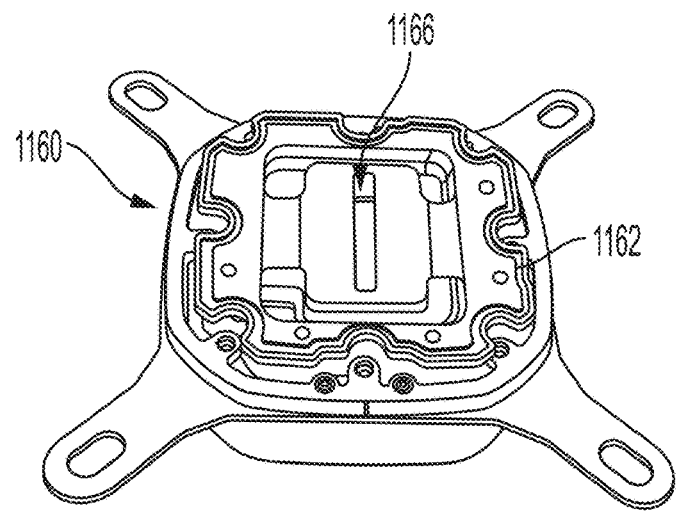
FIG. 16 shows the heat sink of FIG. 15 removed from the transfer housing, exposing a compliant member of a manifold insert.
Figure 16:
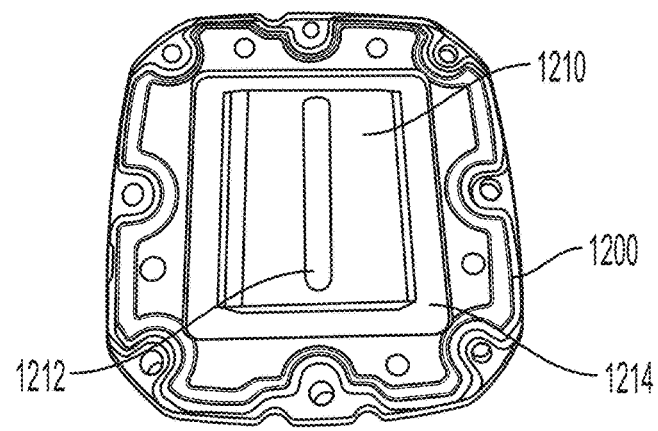

The heat sink 200 may also have a recessed groove (e.g., not shown in FIG. 6 but similar to recessed groove 1212 in FIG. 16) that extends transversely relative to the fins 210. When assembled with the manifold insert 160, the tops of the fins 210 may be in contact with the cold-plate contact surface 169, and the manifold aperture 166 may be above and parallel with the recessed groove. FIG. 16 shows an example of a manifold aperture 1166 arranged to overlie a recessed groove 1212 in a parallel relation. The manifold aperture 166 and a recessed groove may together define an inlet manifold hydraulically coupling in parallel selected ones of the microchannels to at least one other of the microchannels. Accordingly, fluid conveyed through the manifold aperture 166 may enter the microchannels between the fins 210 and bifurcated into two outwardly directed sub-flows flowing along the microchannels from the inlet opening 166 to opposed ends of the microchannels positioned laterally outward of the opening 166. The fluid absorbs heat from the fins 210 as it flows through the microchannels. The manifold insert 160 and the compliant member 162 can leave opposed regions of the recess 109 unoccupied so as to define opposed outlet manifold regions 149 configured to receive coolant from the microchannels 210. The opposed outlet manifold regions 149 (FIG. 12B) can flank the inlet opening 166 outward of the compliant member 162. Coolant collected by the outlet manifold regions 149 can exhaust from the recess 109 through the conduit 143 (FIG. 8), which conveys the coolant to the outlet port 142.

The heat sink 200 may have a flanking groove 214 disposed at an outer perimeter of the fins 210. Fluid exiting the microchannels between the fins 210 can flow into the flanking groove 214. The flanking groove 214 may form a bottom surface of the outlet manifold 149 as shown in FIG. 7. The outlet manifold 149 is fluidically coupled with the outlet conduit 143, which is, in turn, fluidically coupled to the outlet port 142.

A seal 220, e.g., an O-ring, may be used to fluidically seal the outlet manifold 149 when the heat sink 200 is coupled with the transfer housing 140.

The compliant member 162 may define a cold-plate contact surface 169 configured to overlie fins of the cold plate 200. The cold-plate contact surface 169 may flank the opening 166, and the opening 166 can be positioned between ends of the microchannels, permitting coolant passing from the opening 166 into a plurality of microchannels to bifurcate into two, outwardly directed sub-flows within each microchannel.

Figure 7A:
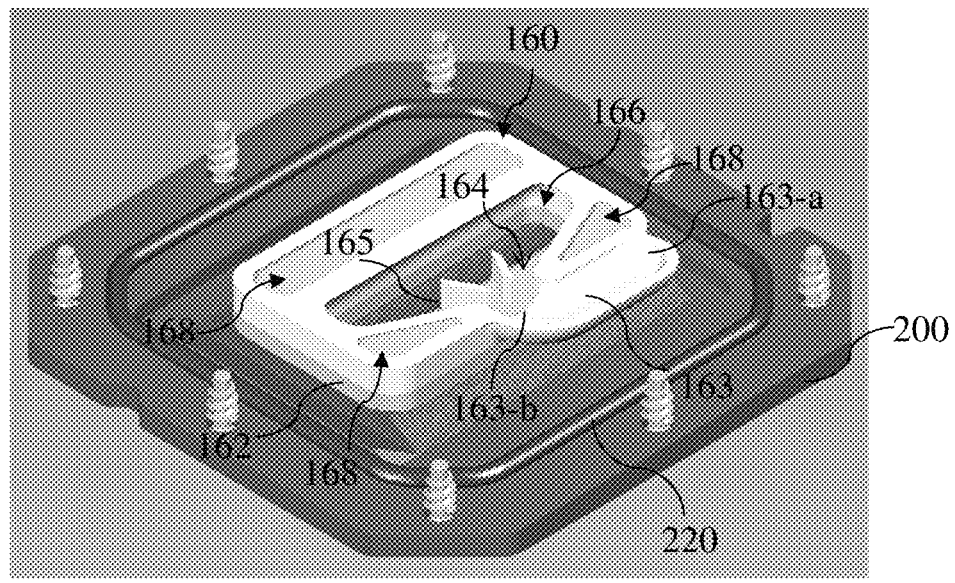
FIG. 7A shows an isometric view of an example of a manifold insert plate with a top layer removed to facilitate viewing internal components.
Figure 7B:
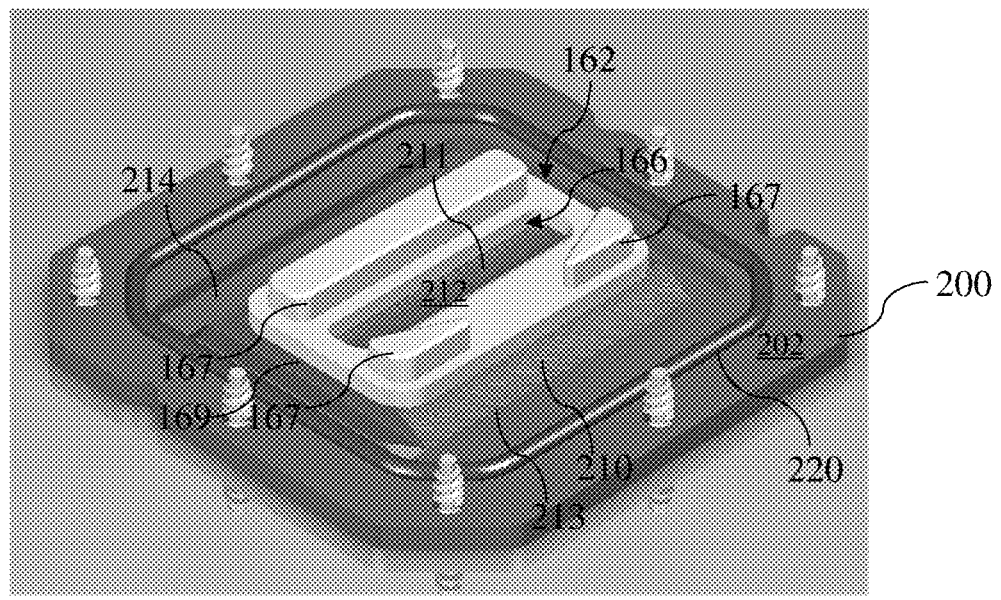
FIG. 7B shows an isometric view of an example of a compliant member of a manifold insert.

FIG. 7A shows an isometric view of the manifold insert 160 with the first major surface 161 removed to facilitate viewing internal components. The manifold insert 160 is coupled to the compliant member 162. FIG. 7B shows an isometric view of the compliant member 162 with the manifold insert 160 removed.

The compliant member 162, the first major surface 161, or both, may be formed using, for example, a molding technique (e.g., injection molding, compression molding, and transfer molding), a machining technique, an extrusion technique, a 3-D printing technique or other suitable process now known or hereafter developed. In a working embodiment, the compliant member 162 is formed of a compliant polymeric material that generally conforms to and seals against adjacent surfaces. Any suitable material can be used to form the compliant member 162, provided that the selected material is compatible with other components of the fluid transfer unit 104 and the selected working fluid. For example, common materials from which the compliant member 162 can be formed include silicone or any other suitably compliant material.

Figure 9:
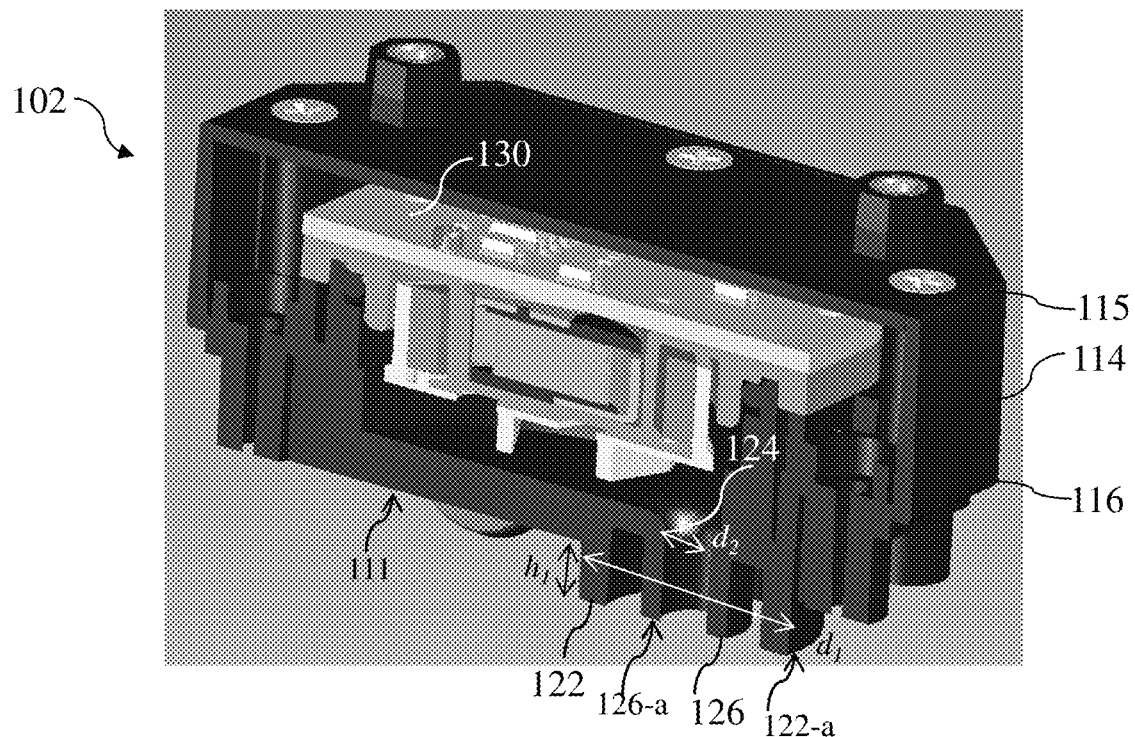
FIG. 9 shows a section view of the fluid receiver unit 102 along line I-I shown in FIGS. 2 and 3.
Figure 10:
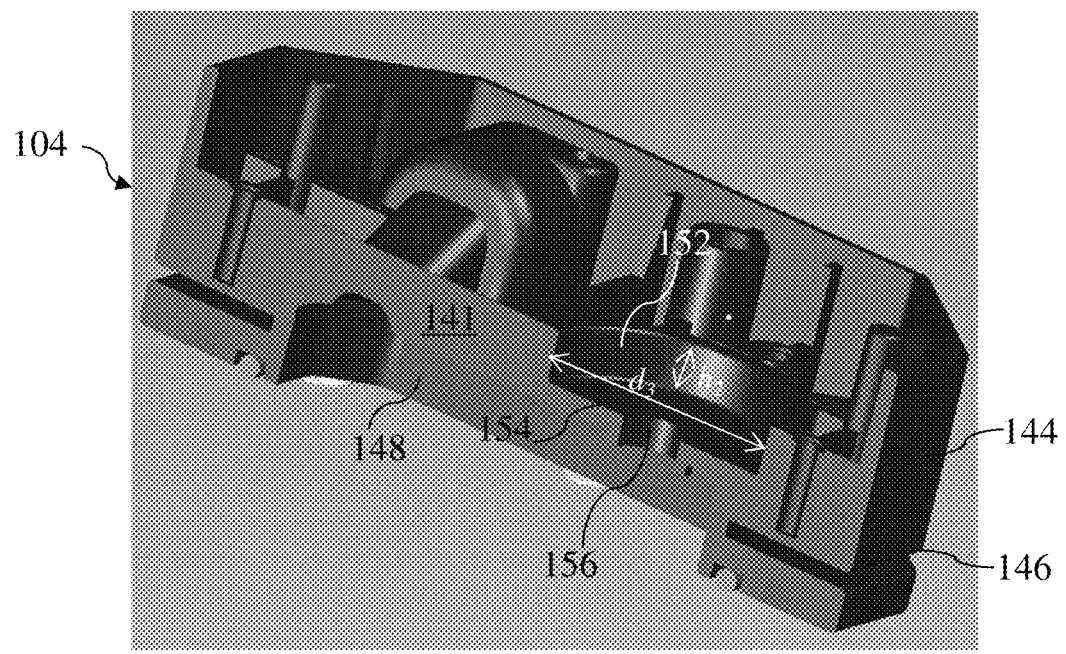
FIG. 10 shows a section view of the fluid transfer unit 104 along line II-II of FIG. 2.

FIG. 9 shows a section view of the fluid receiver unit 102 along line I-I shown in FIGS. 2 and 3. FIG. 10 shows a section view of the fluid transfer unit 104 along line II-II of FIG. 2. As shown in FIG. 9, the support wall 122 may have a diameter $d_1$ and a wall height $h_1$. The fluid aperture 124 may have a diameter $d_2$. When the inner wall 126 is present, its inner diameter may also be $d_2$. In some examples, the diameter of the inner wall 126 may decrease or grow from the diameter $d_2$ at the aperture 124.

In the illustrated example, the end 126-*a* of the inner wall 126 opposite the aperture 124 may be coplanar with the end 122-*a* of the support wall 122. In other examples, the end 126-*a* may extend farther than the end 122-*a* with respect to the surface 111, or may not extend as far as the end 122-*a* with respect to the surface 111 shown in FIG. 9.

As shown in FIG. 10, the support wall 152 may have a diameter $d_3$ and a wall height $h_2$. In the illustrated examples of FIGS. 9 and 10, the difference between $d_3$ and $d_1$ may be sufficient to permit the support wall 122 to be inserted into the volume defined by support wall 152 while allowing support wall 122 to contact support wall 152. In another example, diameter $d_1$ of the support wall 122 may be the same as diameter $d_3$ and the support wall 122 may be compressible such that it can be inserted into the fluid connector 150.

The wall height $h_1$ of the support wall 122 may be less than or equal to the wall height $h_2$ of the support wall 152. When the inner wall 126 is present, it may extend to contact the floor 154. In other examples, the inner wall 126 may extend part way into the volume defined by support wall 152 without contacting the floor 154.

Returning to FIG. 9, the fluid receiver unit 102 may include a pump assembly 130. As will be shown and described further below, the pump assembly 130 may receive a fluid via the inlet port 112 and may circulate the fluid to the fluid connector 120 where the fluid exits the fluid receiver unit 102 via the aperture 124.

Figure 11:
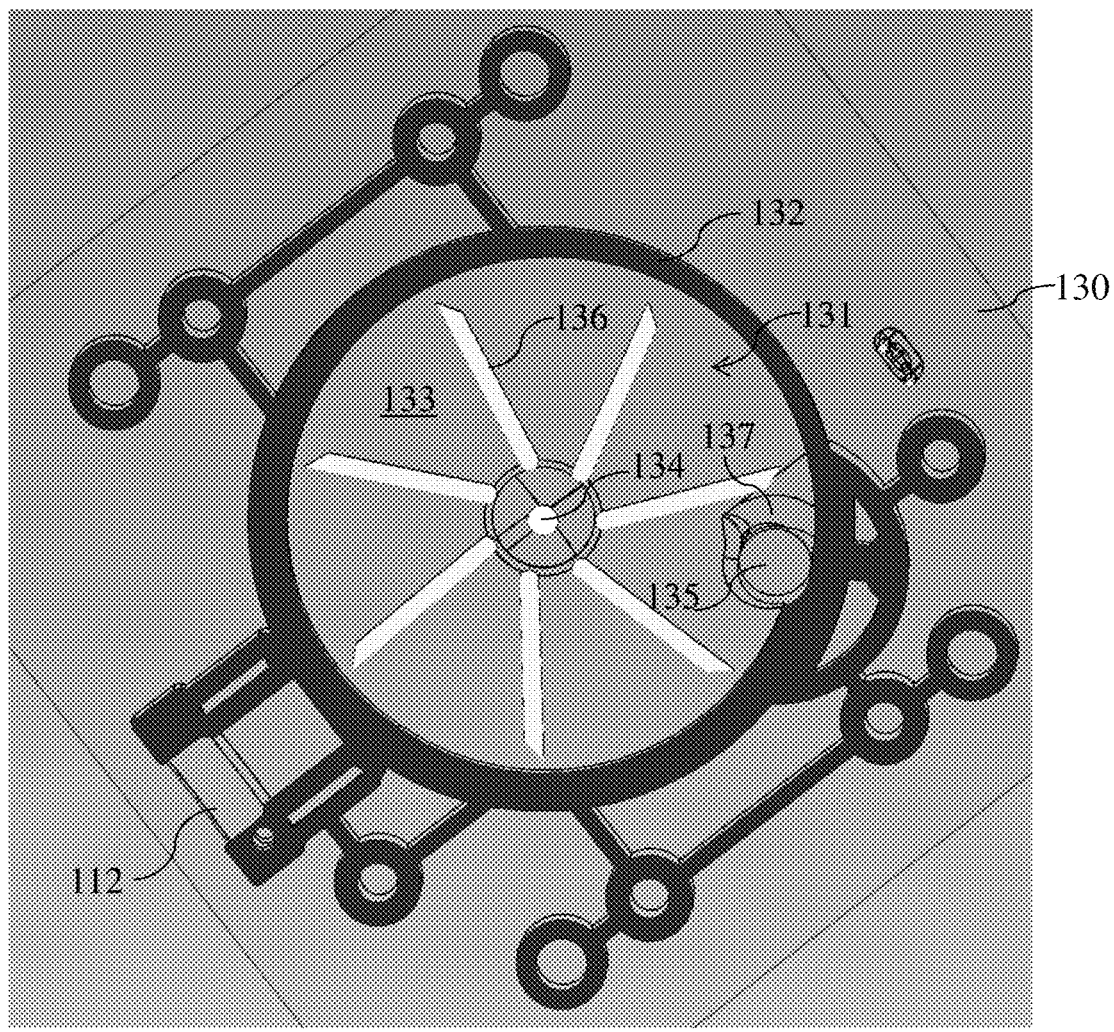
FIG. 11 shows a top plan view of a fluid receiver unit having a top cap cut away to facilitate viewing internal components.

FIG. 11 shows a top plan view of a pump assembly 130 having a top portion cut away to facilitate viewing internal components. The pump assembly may include a pump volute 131 defined by a volute side wall 132 and a bottom wall 133. The bottom wall 133 may define an inlet aperture 134, which is fluidically coupled to the inlet port 112. For example, a conduit may be fluidically coupled to the inlet port 112 and to the inlet aperture 134, and may be positioned below the bottom wall 133 such that fluid flows upward into the pump volute 131.

The inlet aperture 134, as shown, is positioned at the center of the bottom wall 133. In other examples, the inlet aperture 134 may be positioned elsewhere in the bottom wall or may be positioned in the volute side wall 132.

The bottom wall 133 may define an outlet aperture 135. The outlet aperture 135 may be positioned radially outward from the center of the bottom wall 133, for example, at or near the volute side wall 132. Fluid entering the pump volute 131 via the inlet aperture 134 may be circulated by an impeller, comprising one or more impeller vanes 136, to the outlet aperture 135. The impeller may be driven by a motor (not shown).

The bottom wall 133 may include a sloped surface 137 on the up-stream side of the outlet aperture 135. The surface 137 may slope from the bottom wall into the outlet aperture in a downward direction, as determined by gravity. The sloped surface 137 may act as a cutwater by guiding the fluid in the pump volute to discharge through the outlet aperture 135 rather than recirculating in the volute 131. A cutwater is used to divert the fluid away from the volute in a tangential direction to the impeller rotation in the volute. With the outlet aperture 135 in the floor of the pump volute 131 rather than on a side wall, the fluid diverted from the pump volute can move out of the plane of the impeller rotation, e.g., downwardly, instead of tangentially.

The outlet aperture 135 may be fluidically coupled to the aperture 124 of the fluid receiver unit 102. For example, the outlet aperture 135 may be the aperture 124. In another example, the outlet aperture 135 may be fluidically coupled to a separate aperture 124 via a conduit, or a transfer plenum.

Pump assembly 130 is but one example of a pump assembly that may be used in a modular heat exchange system. Other pump assemblies having different configurations of inlets, outlets and impellers may be used in the fluid receiver unit 102 to circulate fluid from the inlet port 112 to the aperture 124. Alternatively, a pump assembly external to the fluid receiver unit 102 may be used to supply fluid to the inlet port 112.

Figure 12A:
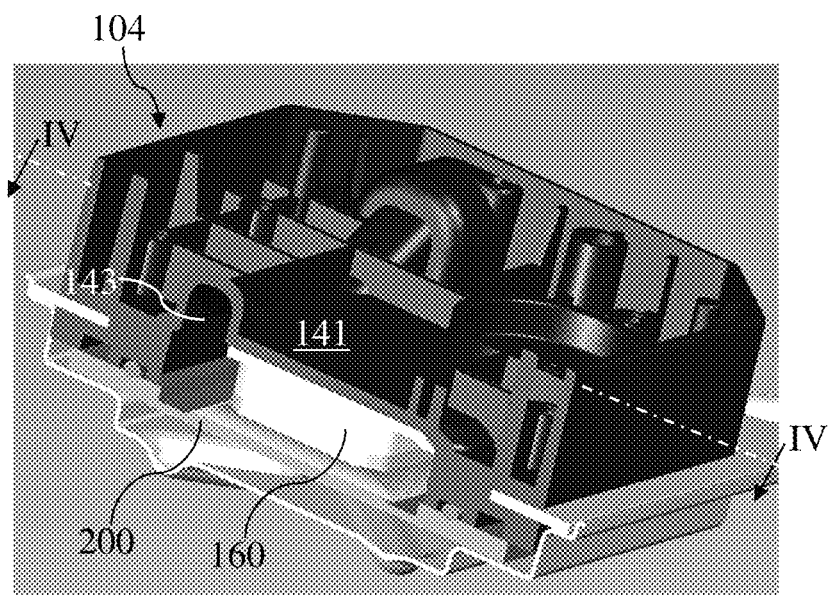
FIG. 12A shows a section view along line III-III of FIG. 2.
Figure 12B:
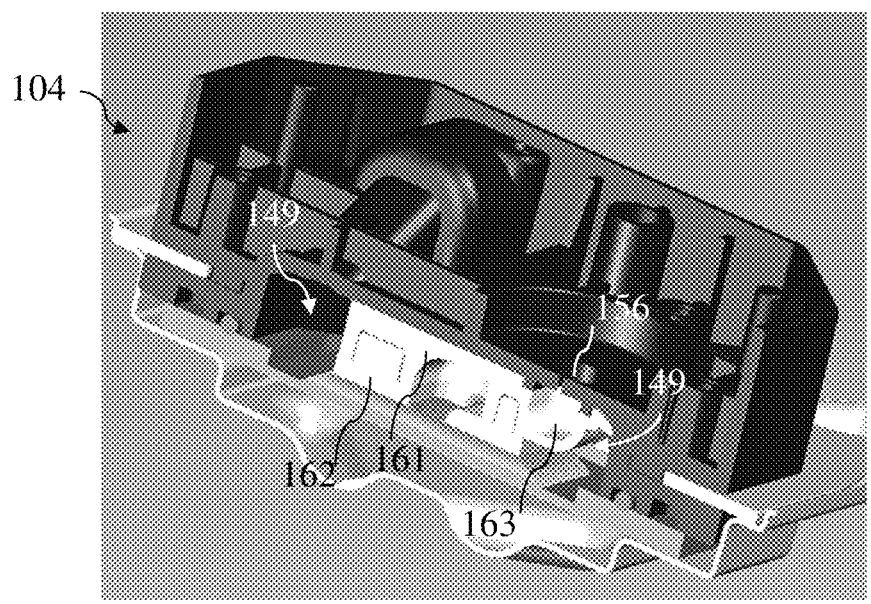
FIG. 12B shows a section view along line IV-IV of FIG. 12A.

FIGS. 12A and 12B show section views of the fluid transfer unit 104. FIG. 12A shows the section view along line III-III of FIG. 2. FIG. 12B shows the section view along line IV-IV of FIG. 12A. As described in detail above, the modular fluid heat exchange assembly 100 may include a heat sink 200. The heat sink 200 may be coupled to the transfer housing 140 and may define, together with the recess 109 and the transfer housing 150, an outlet manifold 149. An example of a heat sink 200 will be described further below.

The manifold insert 160 may be configured to guide a fluid, e.g., a working fluid or coolant, from the fluid connector 150 to the heat sink 200, and then to the outlet port 142 via an outlet conduit 143.

As shown in FIG. 12B, the manifold insert 160 and the compliant member 162 may be fixedly coupled together, detachably coupled together, or a unitary piece.

The manifold insert 160 may be positioned adjacent and in contact with the coupling region 141, and below the aperture 156. The plate 162 may include a conduit 163 that is fluidically coupled to the aperture 156.

IV. Fluid Distribution

Figure 13:
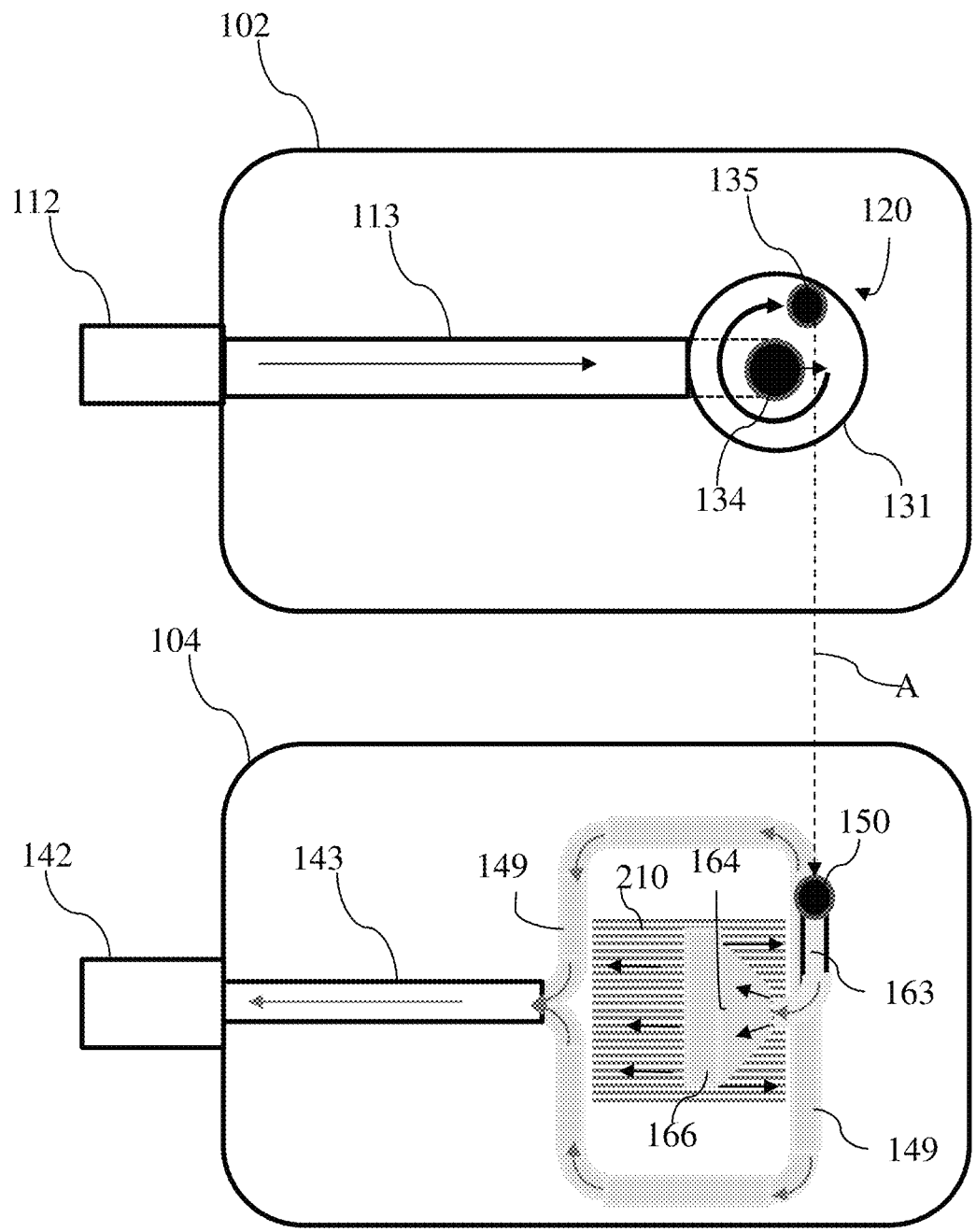
FIG. 13 shows a schematic fluid circuit diagram through an active fluid receiver unit and a fluid transfer unit.

FIG. 13 shows a schematic fluid circuit diagram from the inlet port 112 of the fluid receiver unit 102 to the outlet port 142 of the fluid transfer unit 104. The units 102 and 104 are shown horizontally spaced apart for clarity, however, the fluid circuit depicted in FIG. 13 represents a fluid flow when the units 102 and 104 are matingly engaged, e.g., stacked and connected together as shown, for example, in FIG. 1, or otherwise coupled together.

A working fluid, e.g., a coolant, is supplied at the inlet port 112 from a remotely positioned heat exchange (not shown). The fluid is conveyed, in the direction indicated by the arrows, to the pump volute 131 via the inlet conduit 113. The fluid enters the pump volute 131 via the inlet aperture 134 and circulates. A pump impeller positioned in the pump volute rotates and increases a pressure head in the working fluid before the fluid passes from the pump volute 131 through the outlet aperture 135. The fluid is then conveyed to the fluid transfer unit 104 via the matingly engaged fluid connectors 120 and 150 (e.g., FIGS. 9 and 10), represented by the dashed arrow A. When the unit 102 is stacked vertically above the unit 104, the flow from the unit 102 to the unit 104 may be downward as defined by gravity.

The fluid enters the fluid transfer unit 104 through the connector 150 at the aperture 156 (e.g., FIGS. 4 and 12B) and is conveyed via the channel or conduit 163 to the manifold chamber 164. The fluid enters and flows, e.g., downward, through the manifold aperture 166. The fluid flows into the central region of the heat sink (e.g., into the recessed groove of the heat sink, if present), and outwardly between the fins 210, where it absorbs heat from the fins 210. During operation of the fluid circuit, energy conducts (e.g., diffuses) from the fins of the heat sink into adjacent fluid particles within the microchannels, and the adjacent fluid particles are swept away from the fins, or advected, carrying the energy absorbed from the fins. The swept-away particles are replaced by other, usually cooler fluid particles, which more readily absorb energy from the walls (e.g., by virtue of their usually lower temperature). Such a combination of conduction and advection (i.e., convection) provides an efficient approach for cooling devices having a relatively high heat flux, such as, for example, electronic devices.

Upon exiting the fins 210, the heated fluid collects in the outlet manifold 149 where it is conveyed out of the fluid transfer unit 104 via the outlet conduit 143 and the outlet port 142, carrying with it the energy absorbed from the heat sink.

From the outlet port 142, the heated fluid is conveyed to another heat exchanger (not shown) to reject the heat (e.g., to another working fluid, such as, for example, the air or a building's water supply) through convection processes similar to those described above, and may be returned, cooled, to the inlet port 112.

Figure 14:
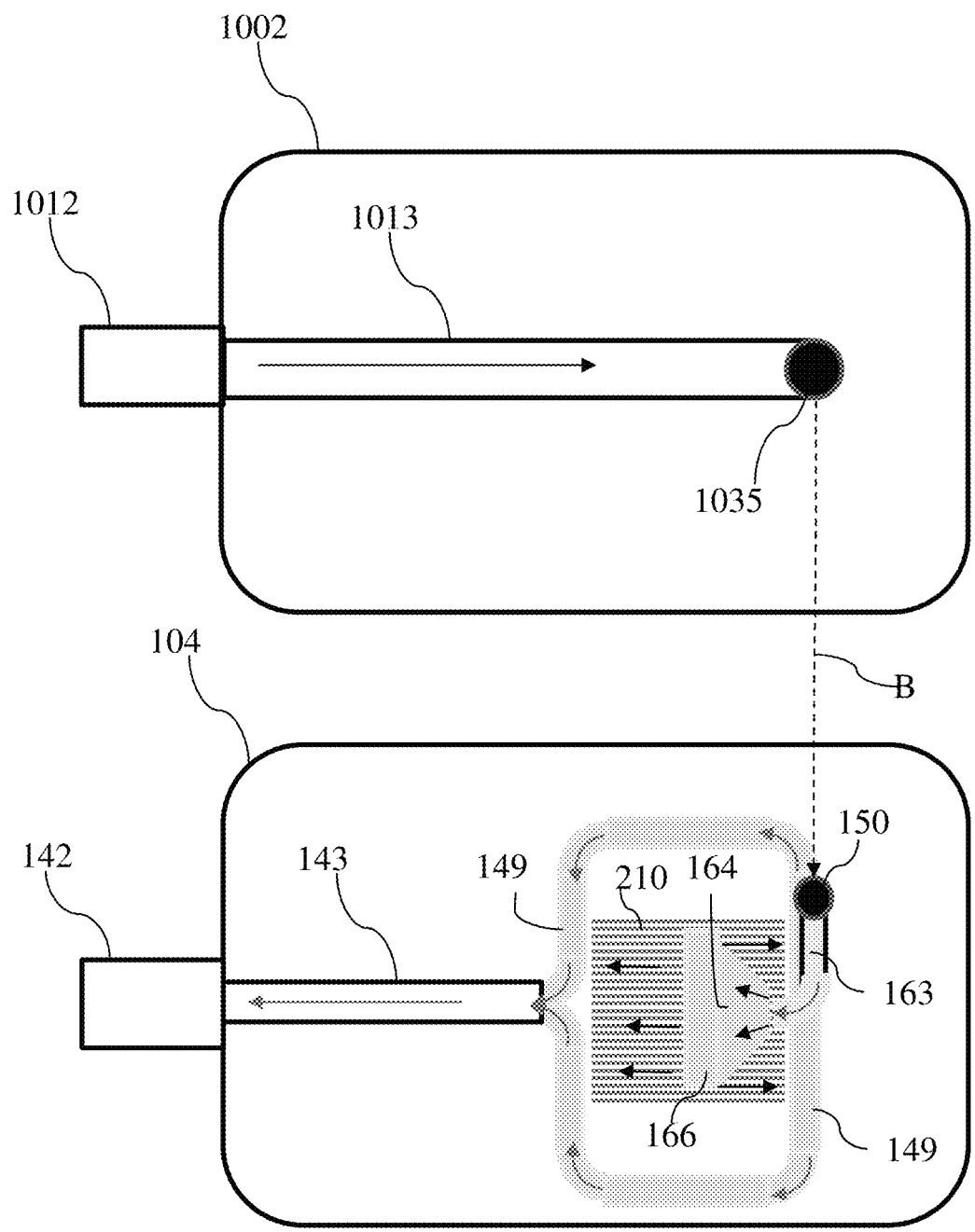
FIG. 14 shows a second schematic fluid circuit diagram through a passive fluid receiver unit and a fluid transfer unit.

FIG. 14 shows a schematic fluid circuit diagram from an inlet port 1012 of a fluid receiver unit 1002 to the outlet port 142 of a fluid transfer unit 104. The fluid receiver unit 1002 may have a fluid connector and receiver coupling region configured to matingly engage with the fluid connector 150 and coupling region 141 of the fluid transfer unit 104 in a manner described above in connection with FIGS. 1-8. The fluid receiver unit 1002 may, however, not have an internal pump. Instead, a working fluid may be supplied at the inlet port 1012, for example, from an externally pressurized supply conduit (e.g., from an external pump). The fluid is conveyed, in the direction indicated by the arrows, to the outlet connector 1035 via the inlet conduit 1013. The outlet connector 1035 may be analogous to the outlet connector 120 described above in relation to, e.g., FIG. 3. The outlet connector 1035 can fluidically couple with the inlet connector 150 incorporated in the fluid transfer unit 104. The fluid is then conveyed to the fluid transfer unit 104 via the matingly engaged fluid connectors, represented by the dashed arrow B.

The flow through the fluid transfer unit 104 may be as described above with respect to FIG. 13. However, if a different heat sink and/or manifold insert are used, the flow from the connector 150 to the outlet conduit 143 may differ between those elements from that depicted in FIG. 13, according to the arrangement of the manifold insert and heat sink.

V. Other Manifold Inserts and Heat Sinks

Figure 15:
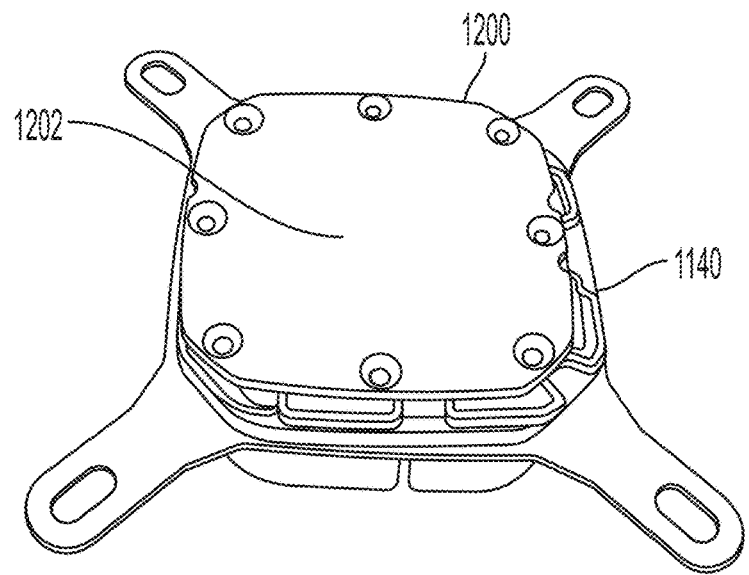
FIG. 15 shows an example of a transfer housing and a heat sink.

FIGS. 15-19 show an example of a manifold insert 1160 and a heat sink 1200 that can be used in combination with a fluid transfer unit as described above. FIG. 15 shows a heat source contact region 1202 of the heat sink 1200 placed on a transfer housing 1140. The heat source contact region 1202 is configured to be thermally coupled to a heat generating component, such as for example a microchip, packaged integrated circuit, or other electronic device, and to absorb heat therefrom. The transfer housing 1140 and the heat sink 1200 are shown upside-down relative to an installation position, where the heat spreader plate would be positioned as the lowermost component relative to the heat dissipating device.

FIG. 16 shows the heat sink 1200 removed from the transfer housing 1140, exposing a compliant member 1162 of the manifold insert 1160. The compliant member 1162 may have a manifold aperture 1166, which is configured to align with and lie above the recessed groove 1212 of the heat sink in an installation position. The heat sink 1200 may be a thermally conductive heat spreader plate having a plurality of juxtaposed fins 1210 extending generally perpendicularly from the heat spreader plate. The fins 1210 may define a corresponding plurality of parallel microchannels between adjacent fins. The heat sink 1200 may have a flanking groove 1214 disposed at an outer perimeter of the fins 1210.

Figure 17:
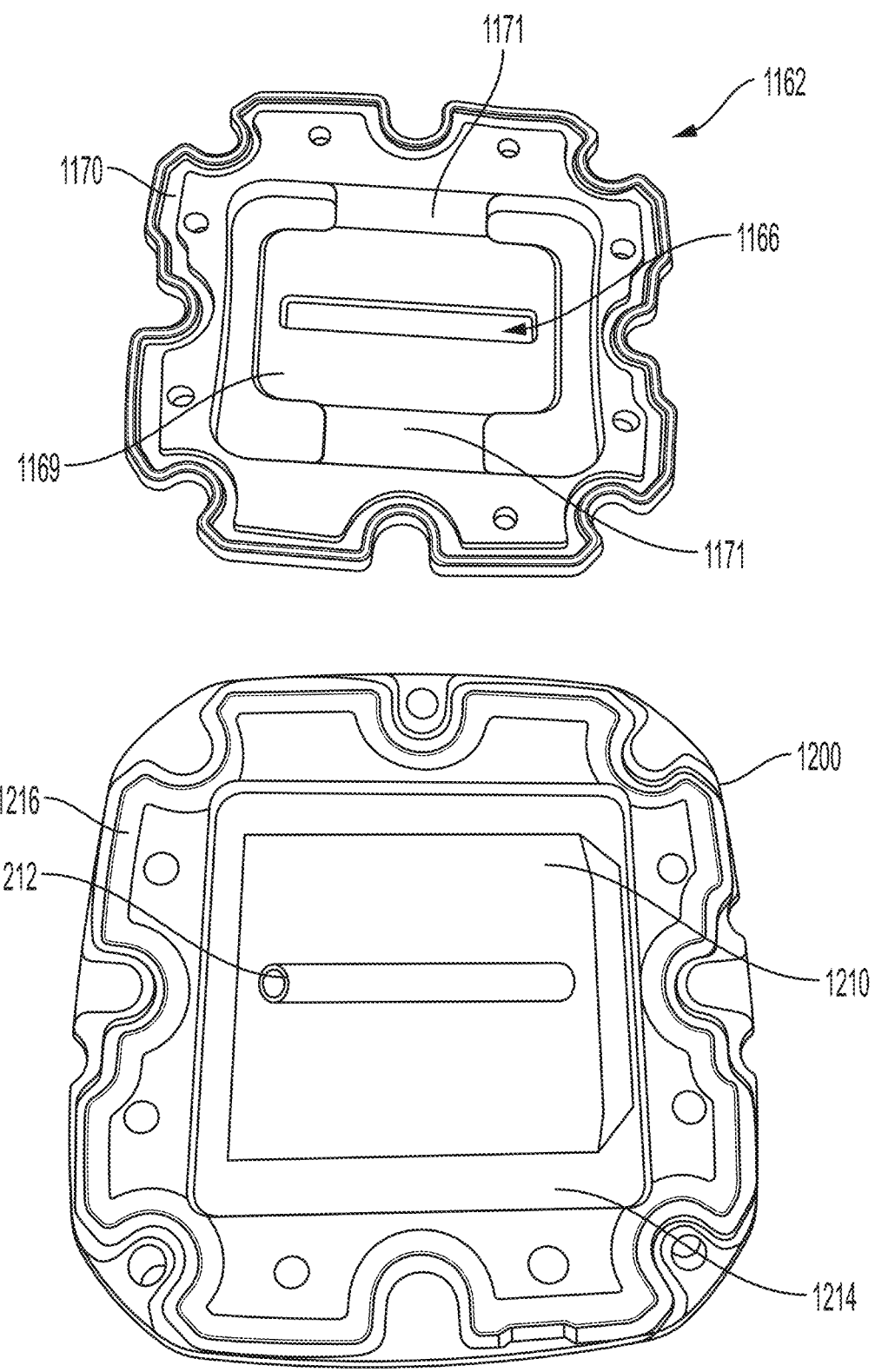
FIG. 17 shows the compliant member removed from the transfer housing and positioned alongside the heat sink.

FIG. 17 shows the compliant member 1162 removed from the transfer housing 1140 and placed alongside the heat sink 1200. The compliant member 1162 is shown upside-down relative to an installation position. The compliant member 1162 may include a heat sink contact surface 1169, which may define a lower extent of the manifold aperture 1166. The compliant member 1162 may include a perimeter gasket 1170. The perimeter gasket 1170 may be configured to be seated in a perimeter recess 1216 in the heat sink 1200. When the heat sink 1200 is coupled to the housing 1140, the perimeter gasket 1170 may fluidically seal the perimeter of the heat sink 1200 with the housing 1140.

The perimeter gasket 1170 may be connected to the heat sink contact surface 1169 by one or more lobes 1171. A lobe 1171 may be coupled to and extend from an outer perimeter of the heat sink contact surface 1169 to an inner perimeter of the perimeter gasket 1170. The lobes 1171 may anchor the heat sink contact surface 1169 so that it stays positioned over the fins 1210 when the heat sink 1200 is coupled to the transfer housing 1140. The lobes 1171 may be configured not to contact the heat sink 1200 so as to permit fluid flow in the exhaust manifold.

Figure 18:
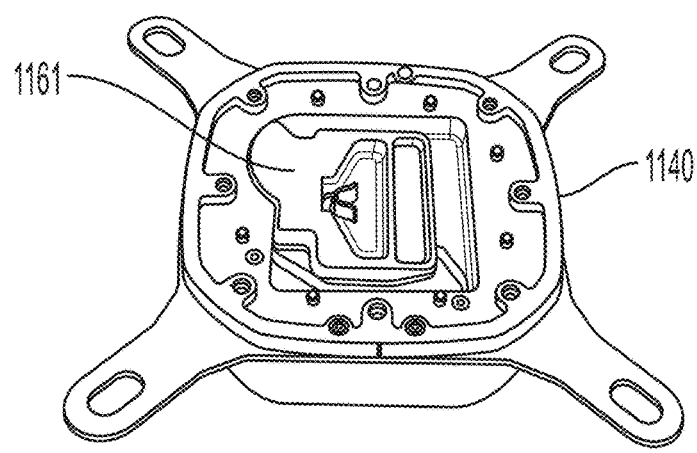
FIG. 18 shows the compliant member and a plate of the manifold insert.
Figure 18:
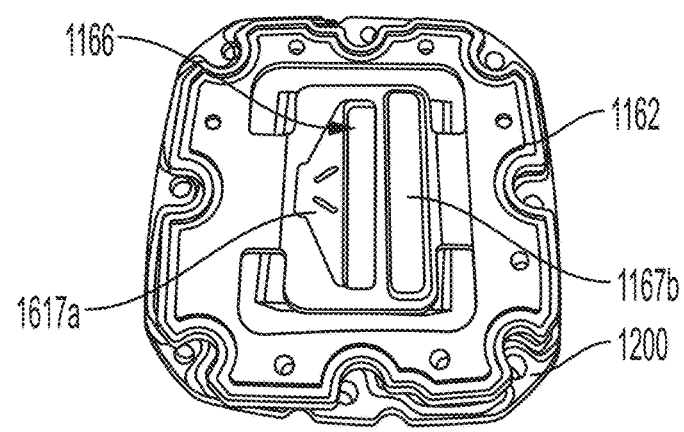
Figure 19:
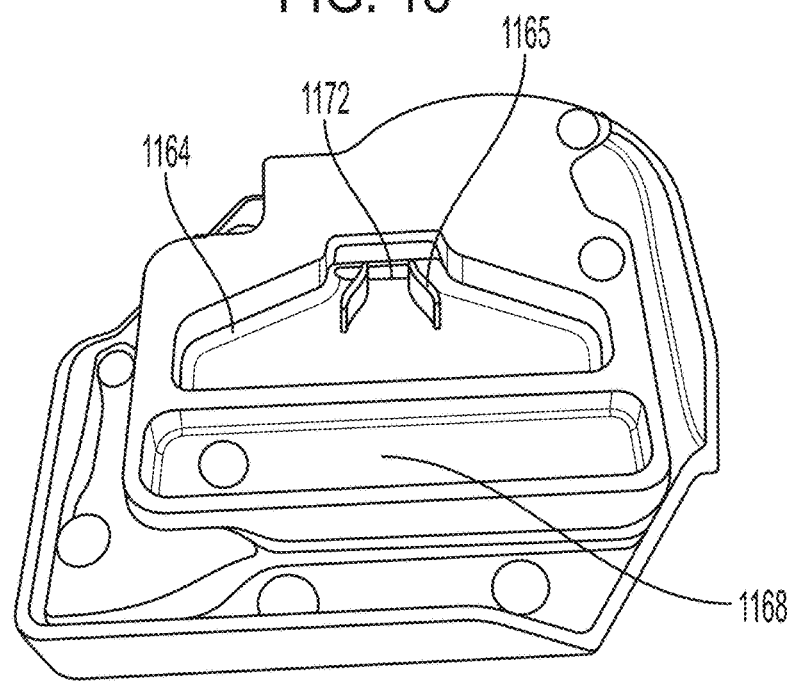
FIG. 19 shows the plate of the manifold insert of FIG. 18.

FIG. 18 shows the compliant member 1162 right-side up in an installation position and placed loosely over the heat sink 1200, and a bottom side of an exposed plate 1161 of the manifold insert 1160 in the transfer housing 1140. FIG. 19 shows a larger view of the bottom side of the plate 1161. The plate 1161 may include a manifold chamber 1164 and turning vanes 1165. The manifold chamber 1164 may be configured to be fluidically coupled to a fluid connector in the transfer housing 1140 at the opening 1172. The plate 1161 may include a recessed region 1168 configured to receive a corresponding boss 1167b defined by the compliant member.

Returning to FIG. 18, the compliant member 1162 may have one or more bosses, such as 1167a and 1167b, on a surface opposite the heat sink contact surface 1169. The bosses may be configured to be seated in the recessed regions of the plate 1161 and may assist in maintaining the alignment of the compliant member 1162 with the plate 1161. For example, the boss 1167b may be configured to sit in the recessed region 1168. The boss 1167a may be configured to sit partially in the manifold chamber 1164 and form the floor of the chamber 1164 without covering the manifold aperture 1166.

Figure 20:
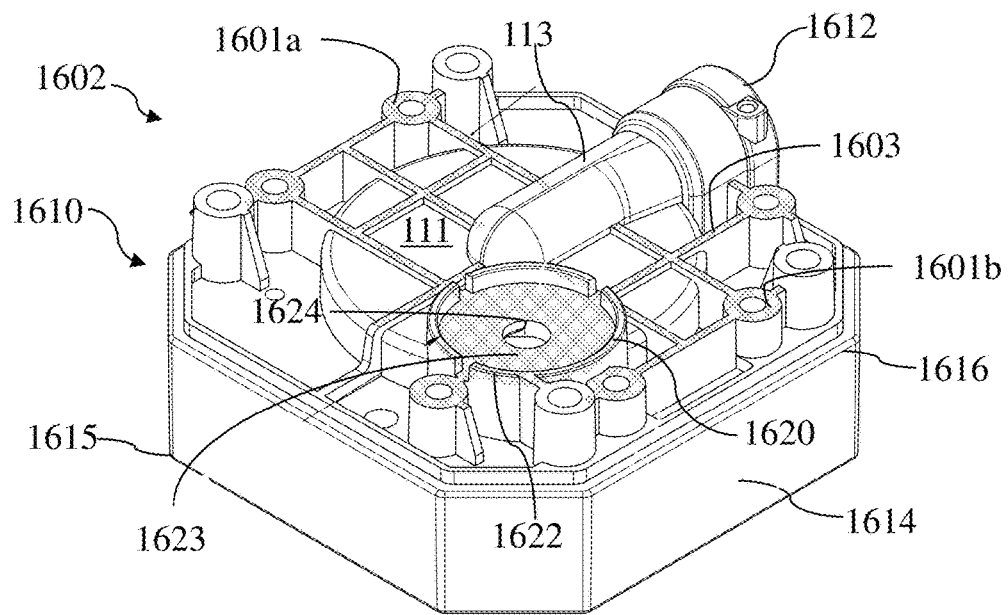
FIG. 20 shows an isometric view of an alternative embodiment of an active fluid receiver unit.
Figure 21:
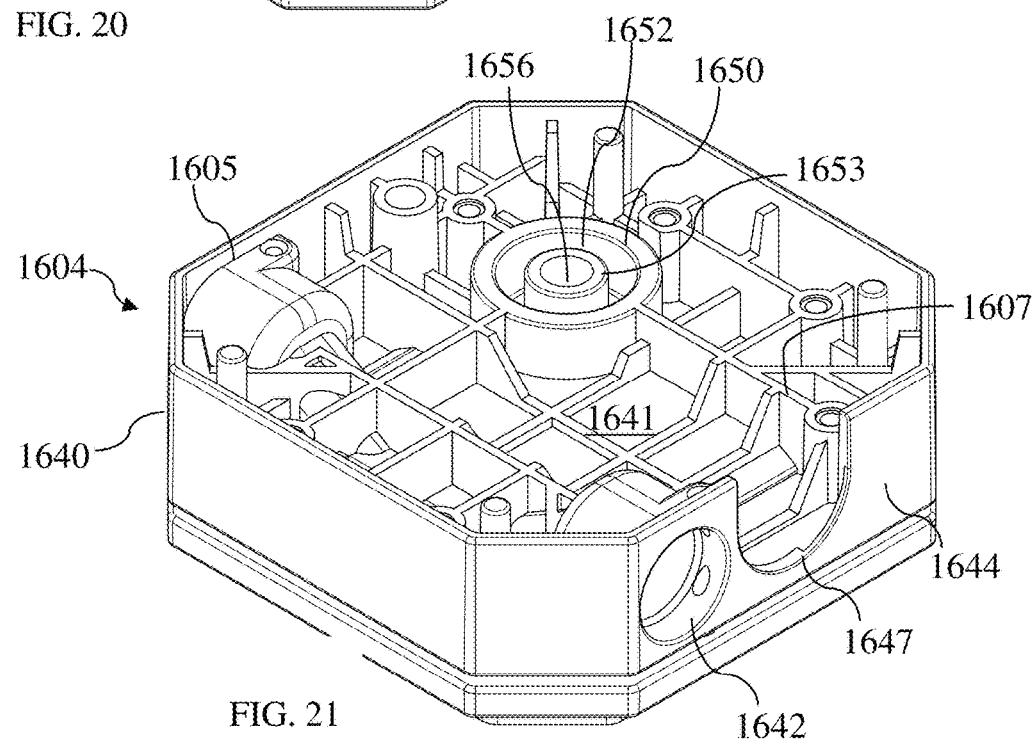
FIG. 21 shows an isometric view of an alternative embodiment of a fluid transfer unit configured to matingly engage with the fluid receiver unit shown in FIG. 20.

FIG. 20 depicts a fluid receiver unit 1602 having features similar to the fluid receiver unit 102 shown in FIGS. 1-6. In FIG. 20, features of the fluid receiver unit 1602 similar to features of the fluid receiver unit 102 are referred using similar reference numerals to those used in FIGS. 1-6, except that the reference numerals in FIG. 20 are 1600-series numbers rather than 100-series numbers as in FIGS. 1-6. Given the similarities, a detailed description of the various features labeled with reference numerals in FIGS. 20-23 is omitted for succinctness.

A notable difference, however, is that the fluid receiver unit 1602 defines a fluid connector 1620 having a face seal similar to the fluid connector 150 defined by the fluid transfer unit 104 in FIGS. 1-6. Nonetheless, the fluid connector 1620 can be configured to be matingly engageable and disengageable with the fluid connector 1650 (FIG. 21) defined by the transfer housing 1640.

The fluid connector 1620 has a segmented circumferential wall 1622 extending around a recessed floor 1623. The patterned shading of the recessed floor 1623 indicates that the floor 1623 is substantially co-planar with the similarly patterned stud faces 1601a, 1601b and face 1603 of the intersecting ribs. The patterned faces of the fluid receiver unit 1602 in FIG. 20 can have a gasket material applied to them. When assembled with the fluid transfer unit 1604, the patterned faces of the fluid receiver unit 1602 can be positioned in opposed relationship to corresponding faces defined by the fluid transfer unit 1604. For example, the co-planar faces of the outer wall 1652 and inner wall 1653 of the fluid connector 1650 can abut the floor 1623 of the fluid connector 1620. Similarly, the patterned rib 1603 can abut and seal with the corresponding rib 1607 in FIG. 21 when the fluid receiver unit 1602 and the fluid transfer unit 1604 are matingly engaged with each other. The gasket material can seal the interface between the fluid receiver unit 1602 and the fluid transfer unit 1604, providing a reliable, fluid-tight interface and inhibiting or altogether preventing leakage of coolant from the connection between the connectors 1620 and 1650.

The connector 1650 can include an outer support wall 1652 that may be insertable within the recessed region circumferentially bounded by the segmented support wall 1622 of the fluid connector 1620. The outer diameter (or perimeter) of the support wall 1652 may be slightly smaller than an inner diameter (or perimeter) of the support wall 1622. Alternatively, the support wall 1622 of the fluid connector 1620 may be insertable into the support wall 1652 of the fluid connector 1650. The support wall 1652 may, for example, function as a stud and the support wall 1622 may function as a socket, similar to a snap closure. Further, the walls 1622 and 1652 may define complementary tapers, as to enhance sealing of a press-fit engagement between the walls. Alternatively, the walls 1622 and 1652 may be vertically oriented without a taper and sized to permit a sliding engagement between the walls, allowing the floor 1623 of the connector 1620 to sealingly abut a corresponding face of the wall 1652 and inner wall 1653.

Figure 22:
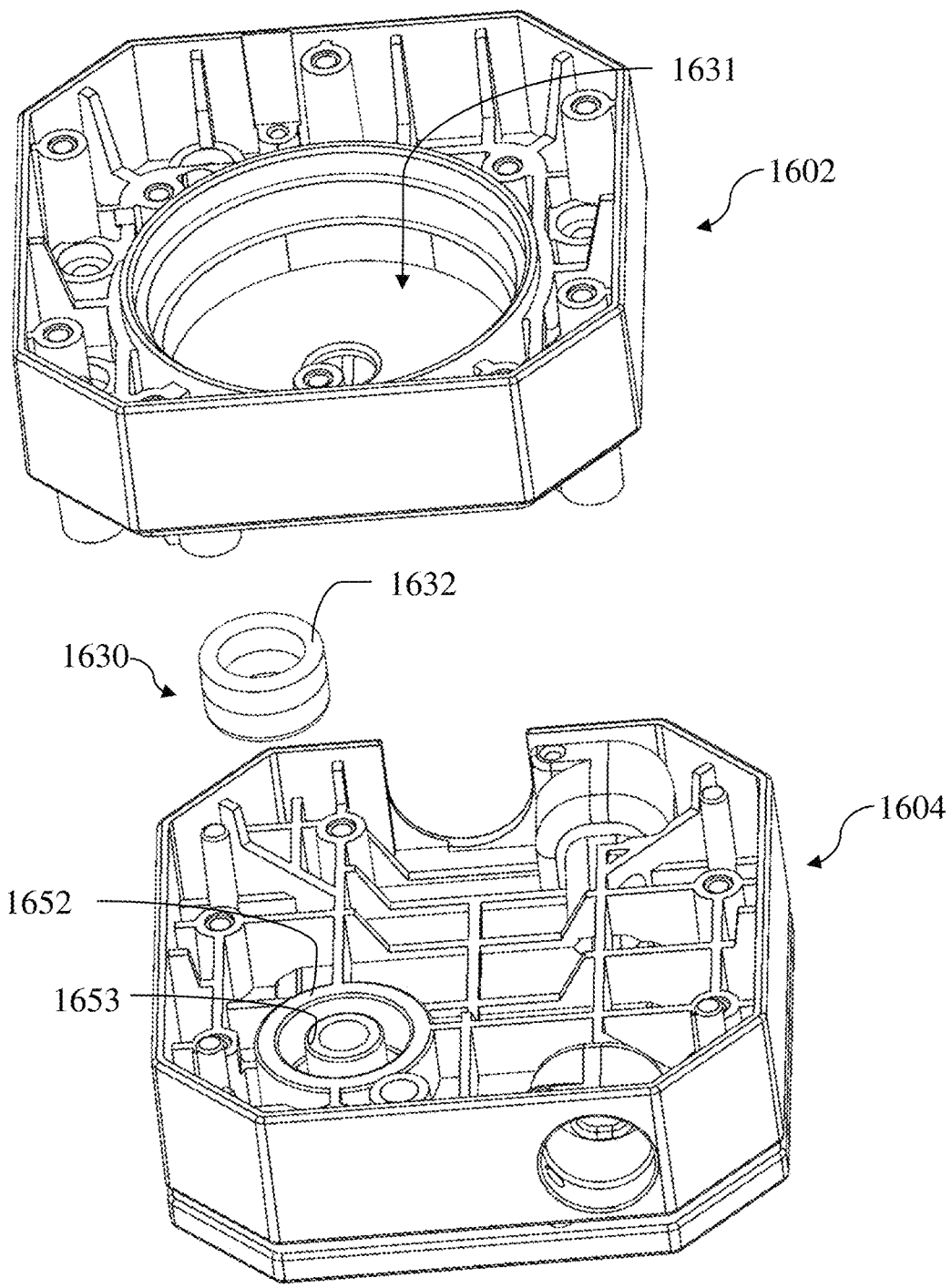
FIG. 22 shows an exploded view of a portion of a component heat exchange assembly including the fluid receiver unit shown in FIG. 20 and the fluid transfer unit shown in FIG. 21.

Further, as shown in FIG. 22, an annular seal or other gasket 1630 can be positioned within the annular recess between the outer wall 1652 and the inner wall 1653 and can extend beyond the end faces of the walls 1652, 1653. An end face 1632 of such a seal or gasket can abut the floor 1623 of the connector 1620, compressing the seal or gasket between the floor of the annular recess defined by the connector 1650 and the floor 1623, causing the seal or gasket 1630 to swell radially and enhance sealing performance of the fluid connection provided by the connectors 1620, 1650.

Figure 23:
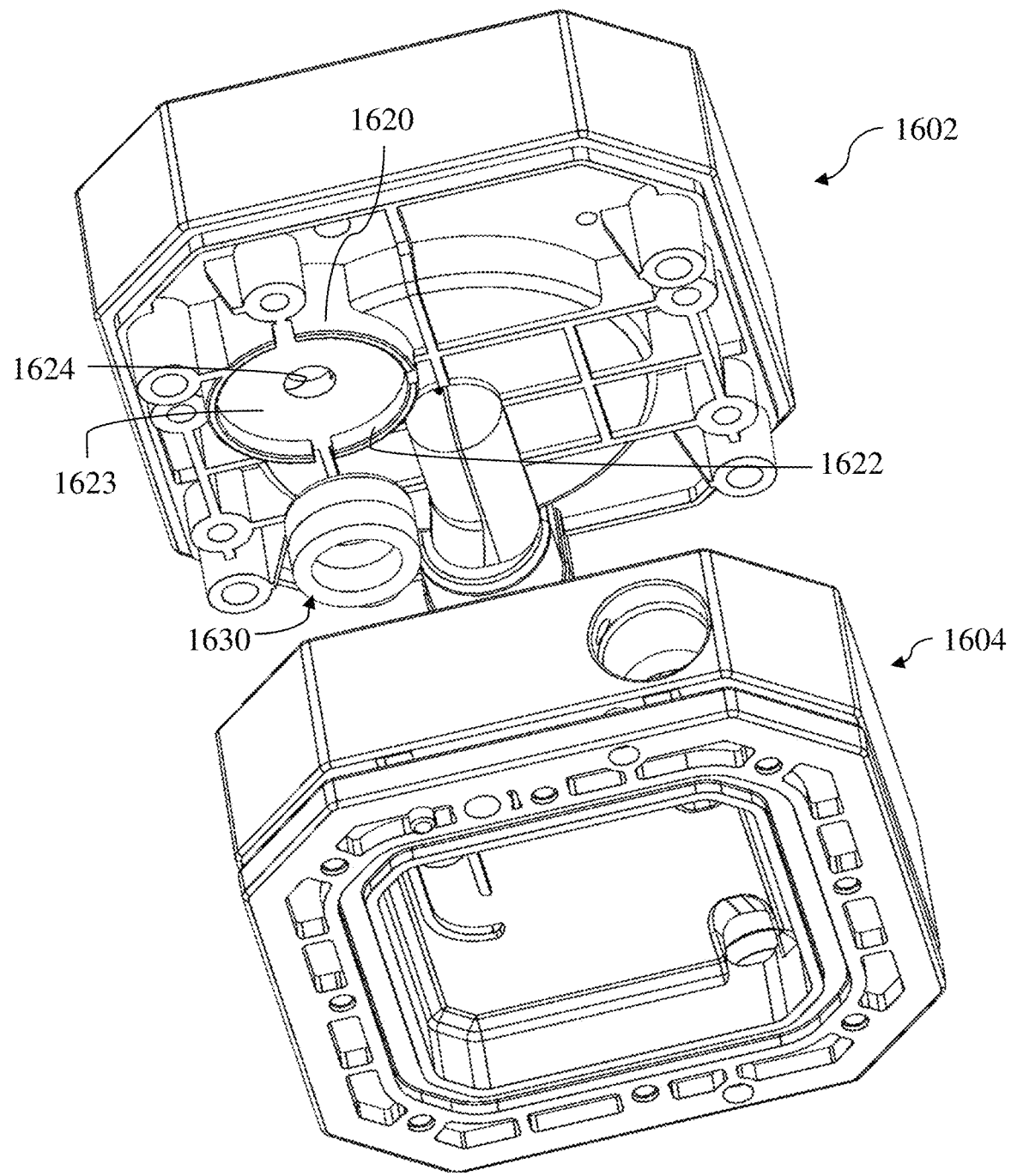
FIG. 23 shows another exploded view of the portion of the component heat exchange assembly shown in FIG. 22.

Referring now to FIG. 23, a fluid connector aperture (or port) 1624 disposed radially inward of the segmented support wall 1622. The port 1624 fluidically couples with the outlet port from the pump volute 1631 (FIG. 22), providing a fluid passage from the pump volute to the fluid connector 1620. The fluid connector aperture 1624 may be positioned centrally with respect to the support wall 1622 or may be positioned off-center. When fluid connector 1620 is matingly engaged with the fluid connector 1650, the fluid connector aperture 1624 may be concentrically aligned with the fluid connector aperture (or inlet port) 1656 (FIG. 21) to the transfer unit 1604. Alternatively, the fluid connector apertures 1624 and 1656 may be fluidically coupled together, for example, by a separate fluid conduit (not shown), without being concentrically aligned with each other. When matingly engaged with each other, the fluid connectors 1620 and 1650 may define a fluidically sealed transfer plenum, or conduit, extending from the aperture 1624 defined by the floor 1623 along the inner wall 1653 through the opening 1656 and into the fluid transfer unit 1604.

In another embodiment, the flow path through the modular fluid heat exchange assembly 100 is reversed from that described above. In such an embodiment, the direction coolant flows through the fluid heat exchange assembly 100 would be opposite to the direction of the arrows depicted in FIGS. 13 and 14 (and described above in relation to FIGS. 1 through 23). For example, cool coolant can enter (rather than exit from) the outlet port 142 and heated coolant can exit from (rather than enter) the inlet port 112. In such an embodiment, coolant passes through the conduit 143 and bifurcates as it enters the outlet manifold 149. The bifurcated flows enter the microchannels defined by the finned heat sink, converging toward each within the microchannels before combining in or near the central region of the heat sink. The re-combined flow of coolant passes, e.g., upward, through the manifold aperture 166. On passing through the manifold aperture, the flow of coolant enters a converging region of the manifold chamber 164, flows along the conduit 163 and through the matingly engaged connectors 120, 150. In such an embodiment, the passageway through the connector 120 (or 1620 in FIG. 20) can open into a peripheral region of the pump volute, as indicated in FIGS. 11 and 13, or, more preferably, the passageway through the connector 120 (1620 in FIG. 20) can open to a more centrally positioned region of the pump volute 131, 1631 (e.g., a location similar to that of the aperture 113a in FIG. 4). In either instance, coolant exiting the pump volute 131, 1631 can enter the conduit 113 and exit from the assembly through the inlet port 112, 1612. In an embodiment lacking a pump, as shown in FIG. 14, coolant that passes through the connector 150, 1650 can flow through an aperture (analogous to aperture 1624, FIG. 20) of the outlet connector 1035, along the conduit 1013, and exhaust from the inlet port 1012.

Other heat sinks and/or manifold inserts may be used, including, for example, those disclosed in U.S. Pat. No. 9,453,691, which is incorporated herein by reference.

Accordingly, users of modular heat exchange systems as disclosed herein may be able to configure and reconfigure installations of the system. For example, a fluid receiver unit that includes a pump may be replaced with a fluid receiver unit with a different pump, e.g., a more reliable pump, a more powerful pump, a more efficient pump, a less expensive pump, and so forth, but without having to replace the fluid transfer unit or the heat sink. The fluid receiver unit may be replaced by a fluid receiver unit without a pump where the inlet port of the fluid receiver unit is fluidically coupled to the output of an external pump. Similarly, a user may change the heat sink and a conforming manifold insert with a different heat sink and manifold insert without having to replace the fluid receiver unit. If a replacement heat sink and manifold insert are configured to fluidically couple to a different fluid transfer unit, then the fluid transfer unit may also be replaced without having to replace the fluid receiver unit. Reconfiguring the installed system may include decoupling the component(s) to be replaced from the other unit and matingly engaging the replacement component to the other unit.

VI. Other Exemplary Embodiments

The examples described above generally concern modular fluidic and heat transfer devices, assemblies and systems configured to cool one or more electronic components, such as, for example, integrated circuits. Nonetheless, other applications for disclosed heat transfer systems are contemplated, together with any attendant changes in configuration of the disclosed apparatus. Incorporating the principles disclosed herein, it is possible to provide a wide variety of systems configured to transfer heat using a fluid circuit. For example, disclosed systems can be used to transfer heat to or from components in a data center, laser components, light-emitting diodes, chemical reactions, photovoltaic cells, solar collectors, and a variety of other industrial, military and consumer devices now known and hereafter developed.

According to another aspect, a modular heat exchange system includes a fluid receiver unit having a receiver housing defining an inlet port and a first fluid connector fluidically coupled with the inlet port. The first fluid connector defines a corresponding first aperture. A fluid transfer unit has a transfer housing defining an outlet port and a second fluid connector fluidically coupled with the outlet port. The second fluid connector defines a corresponding second aperture. The modular heat exchange system also includes a cold plate. The first fluid connector and the second fluid connector are configured to be matingly engageable and disengageable with each other, fluidly coupling the first aperture and the second aperture together. The fluid transfer unit further includes a manifold insert having a conduit fluidically coupled with the second fluid connector aperture, and a manifold aperture configured to convey fluid from the conduit through the manifold insert. The cold plate is coupled to the fluid transfer unit and configured to receive coolant from the manifold aperture. The fluid transfer unit further defines an outlet manifold to receive coolant from the cold plate and a conduit configured to convey the fluid from the outlet manifold to the outlet port. The fluid receiver unit and the fluid transfer unit are configured to be detachably coupled together.

The receiver housing defines a receiver perimeter wall and a receiver coupling region substantially perpendicular to the receiver perimeter wall. The inlet port can be disposed in the receiver perimeter wall. The first fluid connector can be disposed in the receiver coupling region.

The receiver perimeter wall can define a first perimeter edge and a second perimeter edge parallel to the first perimeter edge. The inlet port can protrude perpendicularly from the second perimeter edge and be co-planar with the receiver perimeter wall.

The transfer housing can define a coupling region and a transfer perimeter wall. The coupling region can define a recess. The outlet port can be disposed in the transfer perimeter wall. The second fluid connector can be disposed on the coupling region. The second fluid connector aperture can extend through the coupling region coupling region.

The transfer perimeter wall can define a third perimeter edge and a fourth perimeter edge parallel to the third perimeter edge. An aperture can be configured to receive the inlet port when the fluid receiving unit and the fluid transfer unit are coupled together.

The first fluid connector can include a cylindrical support wall having a first diameter. The first fluid connector aperture can have a second diameter smaller than the first diameter. The second fluid connector can include a cylindrical second fluid connector wall having a third diameter.

The third diameter can be larger than the first diameter and the cylindrical support wall can be configured to be positioned radially inward of the cylindrical second fluid connector wall when matingly engaged with the second fluid connector.

The third diameter can be smaller than the first diameter and the cylindrical support wall can be configured to be positioned radially outward of the cylindrical second fluid connector wall when matingly engaged with the second fluid connector.

The first fluid connector can also include an inner wall extending outwardly from the first fluid connector aperture concentrically to and radially inward from the cylindrical support wall.

The first fluid connector and the second fluid connector, when matingly engaged, can form a fluidically sealed transfer plenum.

The manifold insert can also include a plate defining the conduit as a channel fluidically coupled at a first end to the second fluid connector aperture. A manifold chamber can be fluidically coupled at a first side to a second end of the channel and configured to disperse fluid received from the channel to the manifold aperture. A compliant member can be adjacent the plate and partially define a recess generally coextensive with the manifold aperture.

The heatsink can have a plurality of juxtaposed fins defining a corresponding plurality of microchannels between adjacent fins. A recessed groove can extend transversely relative to the fins. The manifold aperture and the groove together can define an inlet manifold hydraulically coupling in parallel each of the microchannels to at least one other of the microchannels.

The manifold aperture can be positioned above and parallel to the recessed groove of the heat sink. The compliant member can be further configured to contact the tops of the juxtaposed fins without contacting the recessed groove.

The fluid receiver unit housing can define a pump volute having a bottom wall and a side wall. The bottom wall can define an inlet aperture fluidically coupled to the inlet port and an outlet aperture radially outward from the inlet aperture. The outlet aperture can be fluidically coupled to the first fluid connector aperture. The fluid receiver unit can also include an impeller positioned in the pump volute.

The bottom wall can also define a sloped surface from the bottom wall to the outlet aperture configured to convey a fluid from the pump volute to the outlet aperture.

According to another aspect, modular heat exchange system can include a fluid receiver unit and a fluid transfer unit. The fluid receiver unit can include a receiver housing having an inlet port and a first fluid connector fluidically coupled to the inlet port. The first fluid connector can define a first fluid connector aperture. The fluid transfer unit can include a transfer housing having an outlet port and a second fluid connector fluidically coupled to the outlet port. The second fluid connector can define a second fluid connector aperture. The first fluid connector and the second fluid connector can be configured to be matingly engageable and disengageable, and configured to be fluidically coupled when the first fluid connector and the second fluid connector are so matingly engaged.

The fluid transfer unit can also include a manifold insert having a conduit that is fluidically coupled to the second fluid connector aperture. The manifold insert can also have a manifold aperture configured to convey fluid from the conduit through the manifold insert. The fluid receiver unit and the fluid transfer unit can be configured to be detachably coupled together.

The receiver housing can define a receiver perimeter wall and a receiver coupling region substantially perpendicular to the receiver perimeter wall. The inlet port can be disposed in the receiver perimeter wall. The first fluid connector can be disposed in the receiver coupling region coupling region.

The receiver perimeter wall can define a first perimeter edge and a second perimeter edge parallel to the first perimeter edge. The inlet port can protrude perpendicularly from the second perimeter edge and co-planar with the receiver perimeter wall.

The transfer housing can define a coupling region and a transfer perimeter wall. The coupling region can define a recess. The outlet port can be disposed in the transfer perimeter wall. The second fluid connector can be disposed on the coupling region coupling region. The second fluid connector aperture can extend through the coupling region.

The transfer perimeter wall can define a third perimeter edge and a fourth perimeter edge parallel to the third perimeter edge. An aperture can be configured to receive the inlet port when the fluid receiving unit and the fluid transfer unit are coupled together.

The first fluid connector can include a cylindrical support wall having a first diameter. The first fluid connector aperture can have a second diameter smaller than the first diameter. The second fluid connector can include a cylindrical second fluid connector wall having a third diameter.

The third diameter can be larger than the first diameter and the cylindrical support wall can be configured to be positioned radially inward of the cylindrical second fluid connector wall when matingly engaged with the second fluid connector.

The third diameter can be smaller than the first diameter and the cylindrical support wall can be configured to be positioned radially outward of the cylindrical second fluid connector wall when matingly engaged with the second fluid connector.

The first fluid connector can also include an inner wall extending outwardly from the first fluid connector aperture concentrically to and radially inward from the cylindrical support wall. The first fluid connector and the second fluid connector, when matingly engaged, can form a fluidically sealed transfer plenum.

The manifold insert can also include a plate defining the conduit as a channel fluidically coupled at a first end to the second fluid connector aperture. a manifold chamber can be fluidically coupled at a first side to a second end of the channel and configured to disperse fluid received from the channel to the manifold aperture. A compliant member can be adjacent the plate and partially define a recess generally coextensive with the manifold aperture.

The fluid receiver unit housing can define a pump volute having a bottom wall and a side wall. The bottom wall can define an inlet aperture fluidically coupled to the inlet port and an outlet aperture radially outward from the inlet aperture. The outlet aperture can be fluidically coupled to the first fluid connector aperture. The fluid receiver unit can also include an impeller positioned in the pump volute. The bottom wall can also define a sloped surface from the bottom wall to the outlet aperture configured to convey a fluid from the pump volute to the outlet aperture.

According to another aspect, a modular heat exchange system includes a fluid transfer unit and a heat sink. The fluid transfer unit can include a transfer housing having an outlet port and a fluid connector fluidically coupled to the outlet port. The fluid connector can define a fluid connector aperture, and the fluid connector can be configured to receive a fluid. The transfer housing can be configured to be matingly engageable and disengageable with a fluid receiver unit.

The fluid transfer unit can also include a manifold insert having a conduit that is fluidically coupled to the fluid connector aperture, and a manifold aperture configured to convey fluid from the conduit through the manifold insert. The heat sink can be coupled to the fluid transfer unit and disposed adjacent the manifold insert. The heat sink can also be configured to reject heat from the heat sink to the fluid conveyed through the manifold aperture. The fluid transfer unit can convey the fluid to the outlet port.

The transfer housing can define a coupling region and a transfer perimeter wall. The coupling region can define a recess. The outlet port can be disposed in the transfer perimeter wall and the fluid connector can be disposed on the coupling region. The fluid connector aperture can extend through the coupling region.

The manifold insert also can include a plate, a manifold chamber, and a compliant member. The plate can define the conduit as a channel fluidically coupled at a first end to the second fluid connector aperture. The manifold chamber can be fluidically coupled at a first side to a second end of the channel and configured to disperse fluid received from the channel to the manifold aperture. The compliant member can be adjacent the plate and partially define a recess generally coextensive with the manifold aperture.

The heatsink can have a plurality of juxtaposed fins defining a corresponding plurality of microchannels between adjacent fins. A recessed groove can extend transversely relative to the fins. The manifold aperture and the groove together can define an inlet manifold hydraulically coupling in parallel each of the microchannels to at least one other of the microchannels.

The manifold aperture can be positioned above and parallel to the recessed groove of the heat sink.

The compliant member can be further configured to contact the tops of the juxtaposed fins without contacting the recessed groove.

According to yet another aspect, a fluid receiver unit can include a fluid receiver housing having an inlet port and a fluid connector fluidically coupled to the inlet port. The fluid connector can define a fluid connector aperture. A pump volute can be defined in the fluid receiver housing having a bottom wall and a side wall. The bottom wall can define an inlet aperture fluidically coupled to the inlet port and an outlet aperture radially outward from the inlet aperture. The outlet aperture can be fluidically coupled to the fluid connector aperture. An impeller can be positioned in the pump volute. The bottom wall can also define a sloped surface from the bottom wall to the outlet aperture configured to convey a fluid from the pump volute to the outlet aperture.

Directions and references (e.g., up, down, top, bottom, left, right, rearward, forward, etc.) may be used to facilitate discussion of the drawings but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by references in its entirety for all purposes.

The principles described above in connection with any particular example can be combined with the principles described in connection with any one or more of the other examples. Accordingly, this detailed description shall not be construed in a limiting sense, and following a review of this disclosure, those of ordinary skill in the art will appreciate the wide variety of modular fluid heat exchange systems that can be devised using the various concepts described herein. Moreover, those of ordinary skill in the art will appreciate that the exemplary embodiments disclosed herein can be adapted to various configurations without departing from the disclosed principles.

The previous description of the disclosed embodiments is provided to enable any person skilled in the art to make or use the disclosed innovations. Various modifications to those embodiments will be readily apparent to those skilled in the art, and the generic principles defined herein may be applied to other embodiments without departing from the spirit or scope of this disclosure. Thus, the claimed inventions are not intended to be limited to the embodiments shown herein, but are to be accorded the full scope consistent with the language of the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the elements of the claims. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

Thus, in view of the many possible embodiments to which the disclosed principles can be applied, it should be recognized that the above-described embodiments are only examples and should not be taken as limiting in scope. I therefore reserve all rights to the subject matter disclosed herein, including the right to claim all that comes within the scope and spirit of the following claims, as well as all aspects of any innovation shown or described herein.

We currently claim:

1. A modular heat exchange assembly comprising:
    a fluid receiver unit comprising a receiver housing defining an inlet port and a first fluid connector fluidically coupled with the inlet port, wherein the first fluid connector defines a corresponding first aperture;
    a fluid transfer unit comprising a transfer housing defining a segment of a first fluid passageway leading from the first fluid connector of the fluid receiver unit to a distribution manifold;
    a cold plate coupled with the fluid transfer unit;
    a compliant member positioned overtop the cold plate and defining an aperture, the cold plate defining a finned surface and a corresponding plurality of microchannels, wherein selected ones of the plurality of microchannels extend from a first end to an opposed second end and are fluidly coupled with the distribution manifold through the aperture in the compliant member, wherein coolant received by the distribution manifold from the first fluid passageway enters the selected microchannels; and
    a collection manifold configured to collect coolant from the selected microchannels, wherein the fluid transfer unit defines a second passageway that receives the collected coolant.

2. The modular heat exchange assembly according to claim 1, further comprising an impeller.

3. The modular heat exchange assembly according to claim 2, wherein the fluid transfer unit defines a pump volute housing the impeller.

4. The modular heat exchange assembly according to claim 3, wherein the pump volute defines a centrally positioned pump inlet and a peripherally positioned pump outlet, wherein the pump inlet is positioned downstream of the microchannels.

5. The modular heat exchange assembly according to claim 1, wherein the coolant that enters the selected microchannels from the distribution manifold enter the microchannels at the first ends of the microchannels and at the second ends of the microchannels.

6. The modular heat exchange assembly according to claim 1, wherein the collection manifold collects the coolant from a central region of the microchannels positioned between the first ends of the microchannels and at the second ends of the microchannels.

7. The modular heat exchange assembly according to claim 6, wherein the fluid receiver unit defines a pump volute.

8. The modular heat exchange assembly according to claim 7, wherein the second passageway of the fluid passageway conveys the collected coolant to a central region of the fluid receiver unit.

9. The modular heat exchange assembly according to claim 7, wherein the fluid receiver unit defines a centrally positioned inlet to the pump volute.

10. The modular heat exchange assembly according to claim 9, wherein the second passageway of the fluid passageway conveys the collected coolant to the centrally positioned inlet to the pump volute.

11. The modular heat exchange assembly according to claim 10 further comprising an impeller positioned in the pump volute, wherein the pump volute has a peripheral region defining a pump outlet.

12. A modular heat exchange assembly comprising:
    a housing defining a pump volute, an inlet to the pump volute, an exit from the pump volute, and a port fluidically coupled with the exit from the pump volute;
    a fluid transfer unit coupled with the housing;
    a cold plate coupled with the fluid transfer unit, wherein the cold plate defines a plurality of microchannels, wherein each microchannel extends from a first end to an opposed second end and has a central region positioned between the first end and the second end thereof, wherein the housing defining the pump volute is positioned opposite the cold plate relative to the fluid transfer unit, and wherein the fluid transfer unit defines a port for receiving coolant and a fluid passageway fluidically coupling the port with a manifold, wherein the manifold is configured to distribute a flow of coolant among the opposed first and second ends of the microchannels, wherein such distributed flow enters the opposed first and second ends of the microchannels and converges toward the central regions thereof, and
    a compliant member positioned between the cold plate and the fluid transfer unit, the compliant member defining an elongate aperture, wherein a fluid passageway fluidically couples the elongate aperture with the inlet to the pump volute.

13. The modular heat exchange assembly according to claim 12, wherein the compliant member comprises a perimeter gasket.

14. The modular heat exchange assembly according to claim 13, wherein the fluid transfer unit has a perimeter region defining a perimeter recess, wherein the perimeter gasket seats in the perimeter recess when the cold plate is assembled with the fluid transfer unit.

15. The modular heat exchange assembly according to claim 12, wherein the port defined by the fluid transfer unit receives relatively cool coolant and the exit from the pump volute exhausts heated coolant.

16. The modular heat exchange assembly according to claim 15, wherein the heated coolant exits the housing through the port defined by the housing.

17. The modular heat exchange assembly according to claim 15, wherein the heated coolant carries heat received by the coolant from the cold plate.

18. The modular heat exchange assembly according to claim 12, further comprising an impeller positioned in the pump volute.

19. The modular heat exchange assembly according to claim 18, further comprising a motor configured to drive impeller.

20. A modular heat exchange assembly comprising:
a housing defining a pump volute, an inlet to the pump volute, an exit from the pump volute, and a port fluidically coupled with the exit from the pump volute;
a fluid transfer unit coupled with the housing;
a cold plate coupled with the fluid transfer unit, wherein the cold plate defines a plurality of microchannels, wherein each microchannel extends from a first end to an opposed second end and has a central region positioned between the first end and the second end thereof, wherein the housing defining the pump volute is positioned opposite the cold plate relative to the fluid transfer unit;
a distribution manifold positioned between the microchannel central regions and the fluid transfer unit, wherein the fluid transfer unit defines a port for receiving coolant from the housing and to convey the coolant to the distribution manifold, wherein a flow of coolant through the distribution manifold is divided among the plurality of microchannels and recombines after passing through the plurality of microchannels, wherein the fluid transfer unit defines an outlet port and wherein the recombined flow exits through the outlet port defined by the fluid transfer unit.

21. A modular heat exchange assembly according to claim 20, wherein the fluid transfer unit defines a perimeter groove, the modular heat exchange assembly further comprising a compliant member positioned between the fluid transfer unit and the cold plate, the compliant member defining an elongate aperture and a perimeter gasket seated in the perimeter groove defined by the fluid transfer unit.

* * * * *